United States Patent
Chen et al.

(10) Patent No.: US 8,854,240 B2
(45) Date of Patent: Oct. 7, 2014

(54) ANALOG-TO-DIGITAL CONVERTER AND ELECTRONIC APPARATUS

(71) Applicant: Fujitsu Limited, Kawasaki (JP)

(72) Inventors: Yanfei Chen, Yokohama (JP); Sanroku Tsukamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/868,711

(22) Filed: Apr. 23, 2013

(65) Prior Publication Data

US 2013/0321187 A1    Dec. 5, 2013

(30) Foreign Application Priority Data

Jun. 4, 2012   (JP) .................................. 2012-127311

(51) Int. Cl.
*H03M 1/06* (2006.01)
*H03M 1/46* (2006.01)

(52) U.S. Cl.
CPC .............. *H03M 1/06* (2013.01); *H03M 1/0678* (2013.01); *H03M 1/468* (2013.01)
USPC ........... 341/118; 341/122; 341/124; 341/130; 341/155

(58) Field of Classification Search
CPC ........... H03M 1/00; H03M 1/06; H03M 1/14; H03M 1/34; H03M 1/60; H03M 1/66; H03M 1/365; H03M 1/468; H03M 1/0678; H03M 1/0607; H03M 1/0604; H03M 11/03; H03M 11/20; G03G 15/2078; G03G 15/2082; H05B 6/145; G11C 11/406; G11C 11/40603; H03K 4/50; H03K 4/502
USPC ................................................. 341/118–160
See application file for complete search history.

(56) References Cited

U.S. PATENT DOCUMENTS

| | | | | |
|---|---|---|---|---|
| 4,417,233 | A * | 11/1983 | Inoue et al. | .................... 341/156 |
| 7,161,505 | B1 * | 1/2007 | Falik et al. | ...................... 341/26 |
| 7,746,061 | B2 * | 6/2010 | Chang et al. | ................ 324/750.2 |
| 8,004,338 | B2 * | 8/2011 | Sugie | ............................ 327/291 |
| 8,068,047 | B2 * | 11/2011 | Kuramochi et al. | .......... 341/172 |
| 2008/0143574 | A1 | 6/2008 | Kuramochi et al. | |
| 2009/0184857 | A1 | 7/2009 | Furuta et al. | |
| 2013/0135132 | A1 * | 5/2013 | Liu et al. | ....................... 341/158 |

FOREIGN PATENT DOCUMENTS

| | | |
|---|---|---|
| JP | 2006-85668 A | 3/2006 |
| JP | 4153026 B2 | 9/2008 |
| JP | 2009-164914 A | 7/2009 |

OTHER PUBLICATIONS

Liu et al., "A 12b 22.5/45MS/s 3.0mW 0.059mm2 CMOS SAR ADC Achieving Over 90dB SFDR," IEEE International Solid-State Circuits Conference, Session 21, 2010, 3 pages.

* cited by examiner

*Primary Examiner* — Lam T Mai
(74) *Attorney, Agent, or Firm* — Arent Fox LLP

(57) ABSTRACT

An analog-to-digital converter includes a digital-to-analog (DA) converting part having a predetermined number of gradation converting stages and configured to cause each of the predetermined number of gradation converting stages to convert a digital signal to an analog signal and output the converted analog signal, a main-comparator configured to output a binary signal on the basis of a first comparison result between the analog signal output from the DA converting part and a predetermined reference level, and a second sub-comparator having an offset less than a quantization unit with respect to the main-comparator and being configured to output a binary signal on the basis of a second comparison result between the analog signal output from the DA converting part and the predetermined reference level.

17 Claims, 19 Drawing Sheets

FIG.1A
FIG.1B
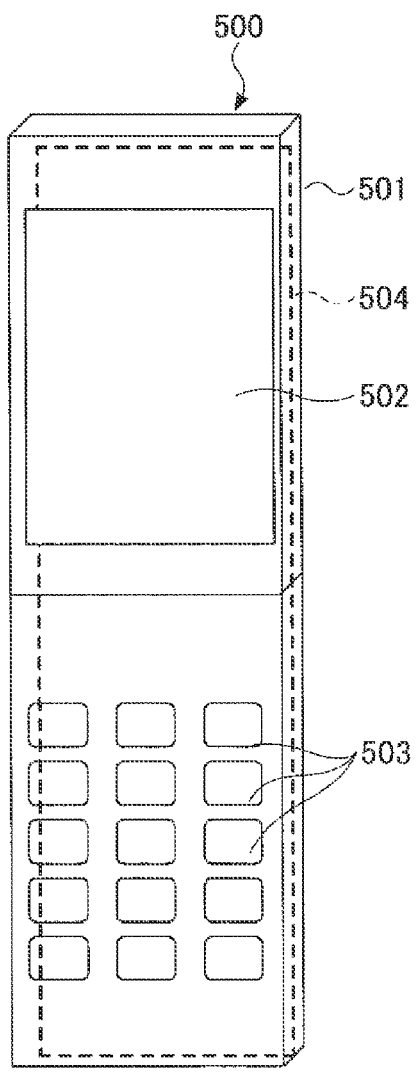
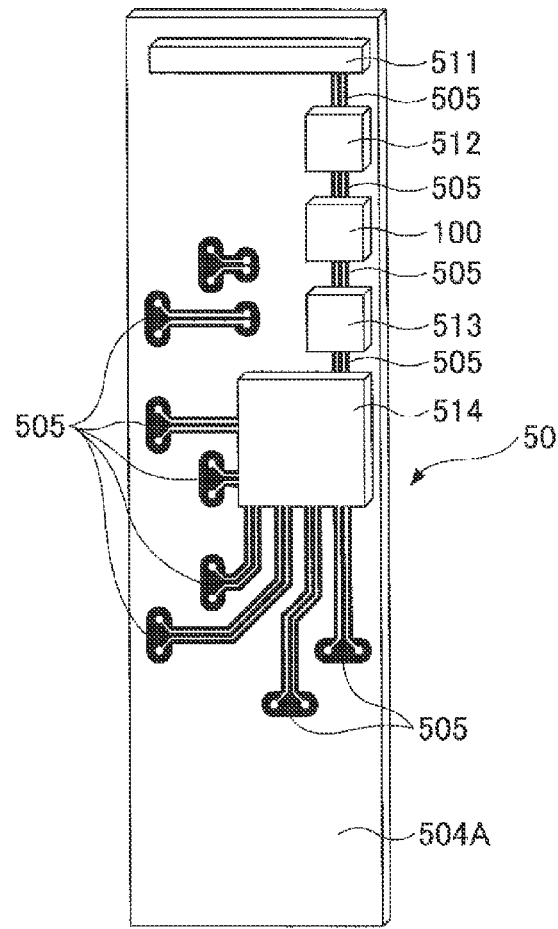

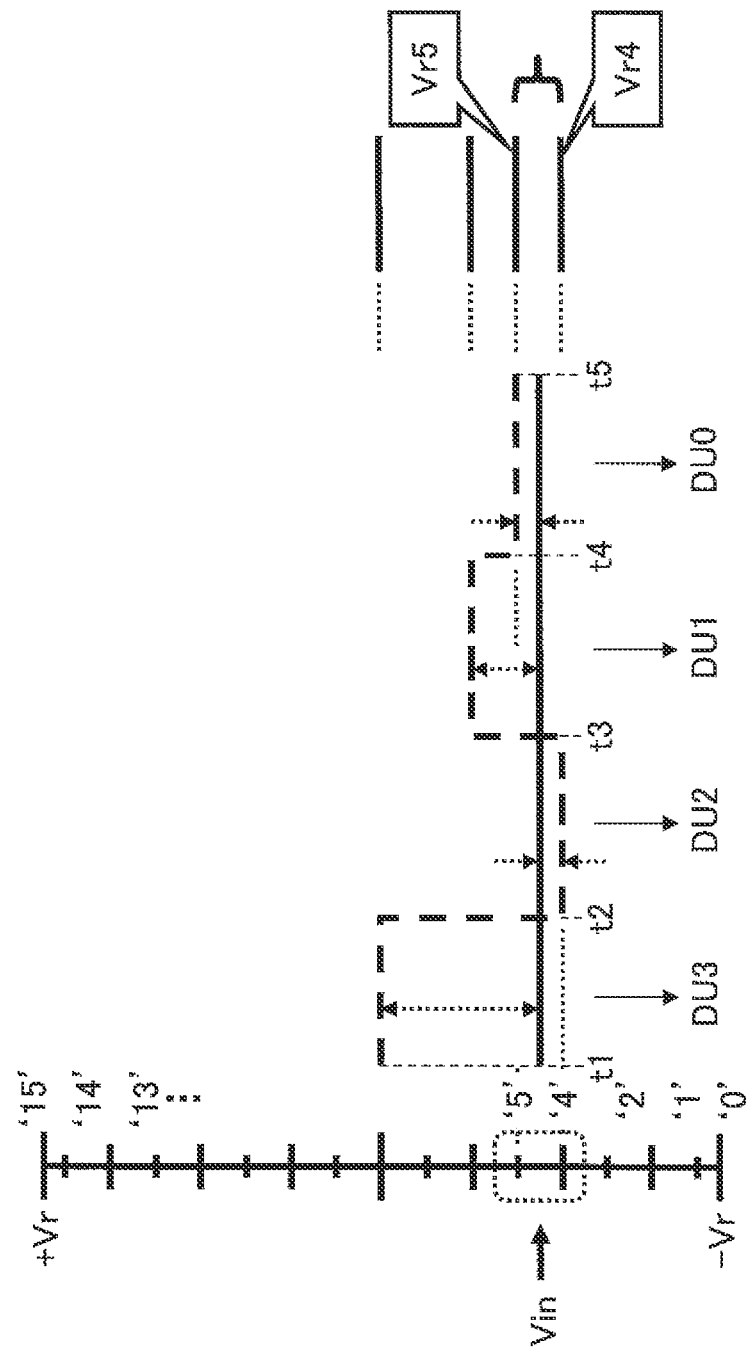

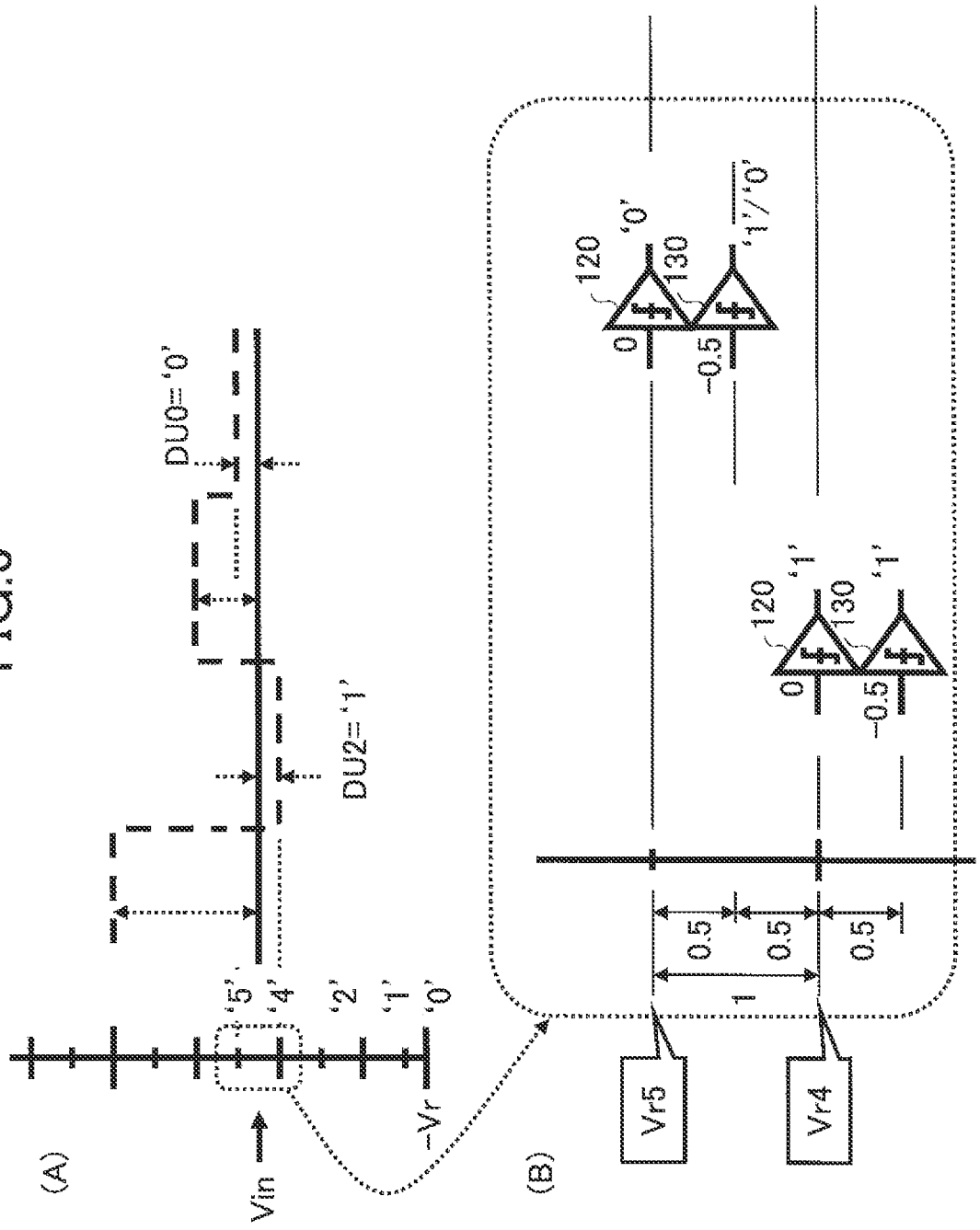

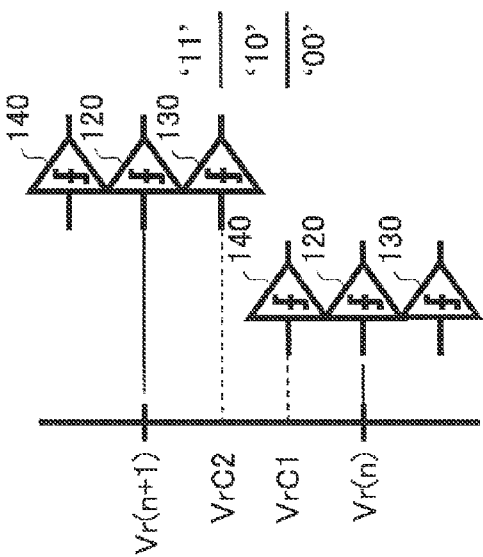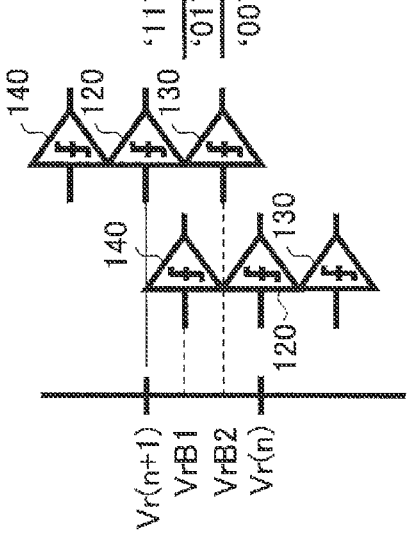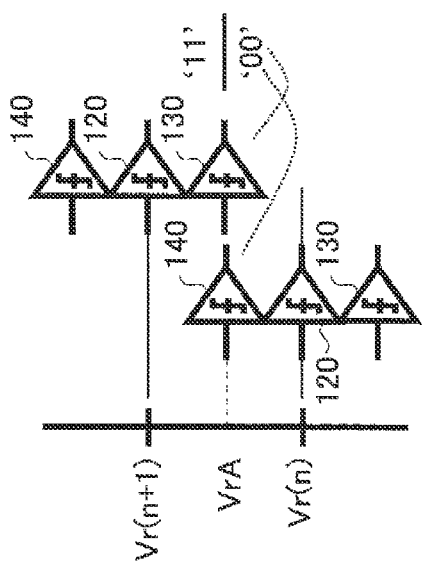

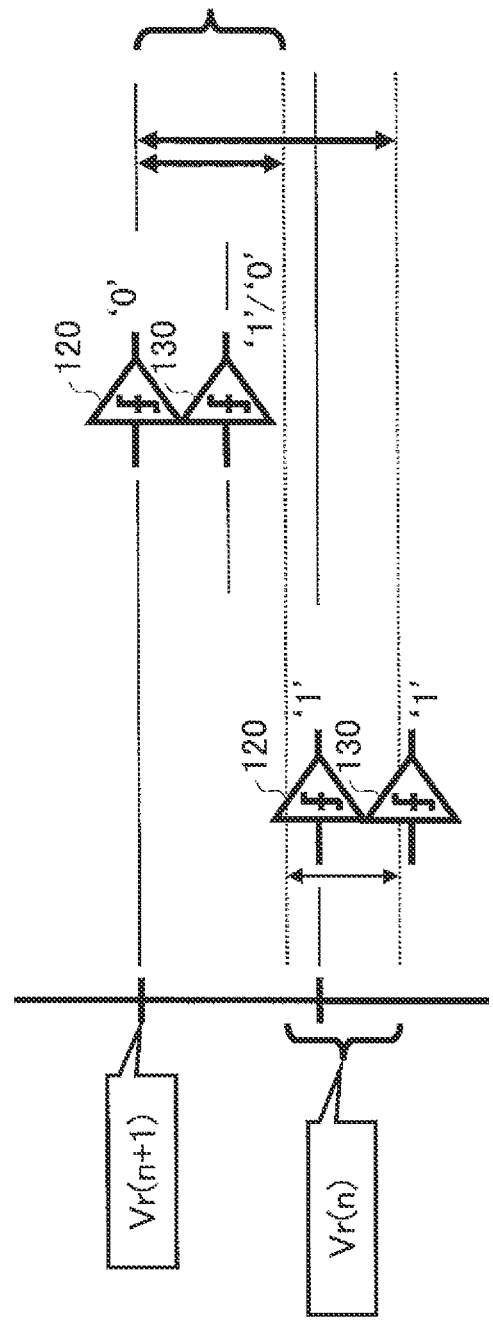

FIG.12

|   | B | C | D | E | F | G |
|---|---|---|---|---|---|---|
| 1 | bit | DU3 | DU2 | DU1 | DU0 | |
| 2 | Ideal | 8 | 4 | 2 | 1 | CAPACITANCE VALUE OF BINARY-WEIGHTED DAC 110 |
| 3 | Error | 0.19 | -0.38 | -0.06 | -0.19 | CAPACITANCE ERROR OF EACH BIT IN DAC 110 |
| 4 | Actual | 8.19 | 3.63 | 1.94 | 0.81 | PRACTICAL WEIGHT OF EACH BIT IN DAC 110 |
| 5 | Calculated | 0.43 | -0.27 | 0.00 | -0.16 | EACH BIT ERROR CALCULATED FROM DNL OF OUTPUT CODE |

|   |   | C | D | E | F | G | H | I | J | K | L | M | N | O |
|---|---|---|---|---|---|---|---|---|---|---|---|---|---|---|
| 7 | | | | | | | Actual Error | | Detected Error | | | After Correction | | |
| 8 | Dout | D3 | D2 | D1 | D0 | Vin EQUIVALENT | DNL | INL | Counts | DNL | INL | Dout_c | INL_c | DNL_c |
| 9 | 15 | 1 | 1 | 1 | 1 | 14.56 | -0.16 | 0.00 | 9.6 | -0.16 | 0.00 | 15.00 | 0.0 | 0.0 |
| 10 | 14 | 1 | 1 | 1 | 0 | 13.75 | 0.16 | 0.16 | 6.9 | 0.16 | 0.16 | 14.16 | 0.0 | 0.0 |
| 11 | 13 | 1 | 1 | 0 | 1 | 12.63 | -0.16 | 0.00 | 9.6 | -0.16 | 0.00 | 13.00 | 0.0 | 0.0 |
| 12 | 12 | 1 | 1 | 0 | 0 | 11.81 | -0.10 | 0.17 | 8.9 | -0.10 | 0.17 | 12.17 | 0.0 | 0.0 |
| 13 | 11 | 1 | 0 | 1 | 1 | 10.94 | -0.16 | 0.27 | 9.6 | -0.16 | 0.27 | 11.27 | 0.0 | 0.0 |
| 14 | 10 | 1 | 0 | 1 | 0 | 10.13 | 0.16 | 0.43 | 6.9 | 0.16 | 0.43 | 10.43 | 0.0 | 0.0 |
| 15 | 9 | 1 | 0 | 0 | 1 | 9.00 | -0.16 | 0.27 | 9.6 | -0.16 | 0.27 | 9.27 | 0.0 | 0.0 |
| 16 | 8 | 1 | 0 | 0 | 0 | 8.19 | 0.87 | 0.43 | 4.3 | 0.87 | 0.43 | 8.43 | 0.0 | 0.0 |
| 17 | 7 | 0 | 1 | 1 | 1 | 6.38 | -0.16 | -0.43 | 9.6 | -0.16 | -0.43 | 6.57 | 0.0 | 0.0 |
| 18 | 6 | 0 | 1 | 1 | 0 | 5.56 | 0.16 | -0.27 | 6.9 | 0.16 | -0.27 | 5.73 | 0.0 | 0.0 |
| 19 | 5 | 0 | 1 | 0 | 1 | 4.44 | -0.16 | -0.43 | 9.6 | -0.16 | -0.43 | 4.57 | 0.0 | 0.0 |
| 20 | 4 | 0 | 1 | 0 | 0 | 3.63 | -0.10 | -0.27 | 8.9 | -0.10 | -0.27 | 3.73 | 0.0 | 0.0 |
| 21 | 3 | 0 | 0 | 1 | 1 | 2.75 | -0.16 | -0.17 | 9.6 | -0.16 | -0.17 | 2.83 | 0.0 | 0.0 |
| 22 | 2 | 0 | 0 | 1 | 0 | 1.94 | 0.16 | 0.00 | 6.9 | 0.16 | 0.00 | 2.00 | 0.0 | 0.0 |
| 23 | 1 | 0 | 0 | 0 | 1 | 0.81 | -0.16 | -0.16 | 9.6 | -0.16 | -0.16 | 0.84 | 0.0 | 0.0 |
| 24 | 0 | 0 | 0 | 0 | 0 | 0.00 | 0.00 | 0.00 | 0.0 | 0.00 | 0.00 | 0.00 | 0.0 | 0.0 |

ANALOG-TO-DIGITAL CONVERTER AND ELECTRONIC APPARATUS

CROSS-REFERENCE TO RELATED APPLICATION

This application is based upon and claims the benefit of priority of the prior Japanese Patent Application No. 2012-127311 filed on Jun. 4, 2012, the entire contents of which are incorporated herein by reference.

FIELD

The disclosures discussed herein relate to an analog-to-digital converter and an electronic apparatus.

BACKGROUND

A related art method of operating an analog-to-digital (AD) converter may include operating the AD converter in a first mode to acquire a first conversion result, and operating the AD converter in a correction mode in which the AD converter performs at least one correction conversion. An example of the related art disclosing such a method includes Japanese National Publication of International Patent Application No. 2009-164914 (hereinafter referred to as "Patent Document 1").

Further, another method of performing an analog-to-digital (AD) conversion may include supplying known analog voltages +ΔV and −ΔV to sampled analog signals, performing the AD conversion on the respective analog signals, detecting errors by adding to or subtracting from the AD conversion results respective digital values corresponding to the ΔV so as to correct the detected errors (e.g., see "Non-Patent Document 1" below).

RELATED ART DOCUMENT

Patent Document

Patent Document 1: Japanese National Publication of International Patent Application No. 2009-164914

Non-Patent Document

Non-Patent Document 1: Wenbo Liu, Pingli Huang, Yun Chiu; A 12b 22.5/45 MS/s 3.0 mW 0.059 mm2 CMOS SAR ADC Achieving Over 90 dB SFDR, IEEE International Solid-State Circuits Conference, pp. 380-381, February 2010.

The related art analog-to-digital (AD) converter may exhibit the reduced conversion rate due to the fact that the AD converter performs the correction of conversion in addition to acquiring the first conversion result.

Further, the related art AD conversion method may exhibit the reduced conversion rate due to the fact that the AD converter performs the AD conversion while giving the known analog voltages +ΔV and −ΔV for shifting a determination point.

Thus, it may be desirable to provide an AD converter having an improved conversion rate, and an electronic apparatus having such an AD converter.

SUMMARY

According to an aspect of the embodiments, an analog-to-digital converter includes a digital-to-analog (DA) converting part having a predetermined number of gradation converting stages and configured to cause each of the predetermined number of gradation converting stages to convert a digital signal to an analog signal and output the converted analog signal; a main-comparator configured to output a binary signal on the basis of a first comparison result between the analog signal output from the DA converting part and a predetermined reference level; and a second sub-comparator having an offset less than a quantization unit with respect to the main-comparator and being configured to output a binary signal on the basis of a second comparison result between the analog signal output from the DA converting part and the predetermined reference level.

The object and advantages of the invention will be realized and attained by means of the elements and combinations particularly pointed out in the appended claims.

It is to be understood that both the foregoing general description and the following detailed description are exemplary and explanatory and are not restrictive of the invention.

Additional objects and advantages of the embodiments will be set forth in part in the description which follows, and in part will be obvious from the description, or may be learned by practice of the invention.

BRIEF DESCRIPTION OF THE DRAWINGS

FIGS. 1A and 1B are diagrams illustrating a mobile phone terminal 500 including an analog-to-digital (AC) converter 100 according to a first embodiment;

FIG. 5 is a diagram illustrating a change in a reference voltage of a comparator 120 with time while the AD converter 100 according to the first embodiment performs AD conversion, and digital signals DU3, DU2, DU1, and DU0;

FIG. 6 is a diagram illustrating an operating relationship between the comparator 120 and an auxiliary comparator 130 in the AD converter 100 according to the first embodiment;

FIGS. 9A through 9C are schematic diagrams illustrating relationships between reference voltages of the comparator 120 and the auxiliary comparators 130 and 140, and digital signals in the AD converter 100 according to the first embodiment;

FIG. 10 is a diagram illustrating an offset adjusting method of the auxiliary comparator 130 in the AD converter 100 according to the first embodiment;

FIG. 12 is a diagram illustrating a digital signal Dout corrected by the AD converter 100 according to the first embodiment;

DESCRIPTION OF EMBODIMENTS

Figure 2:
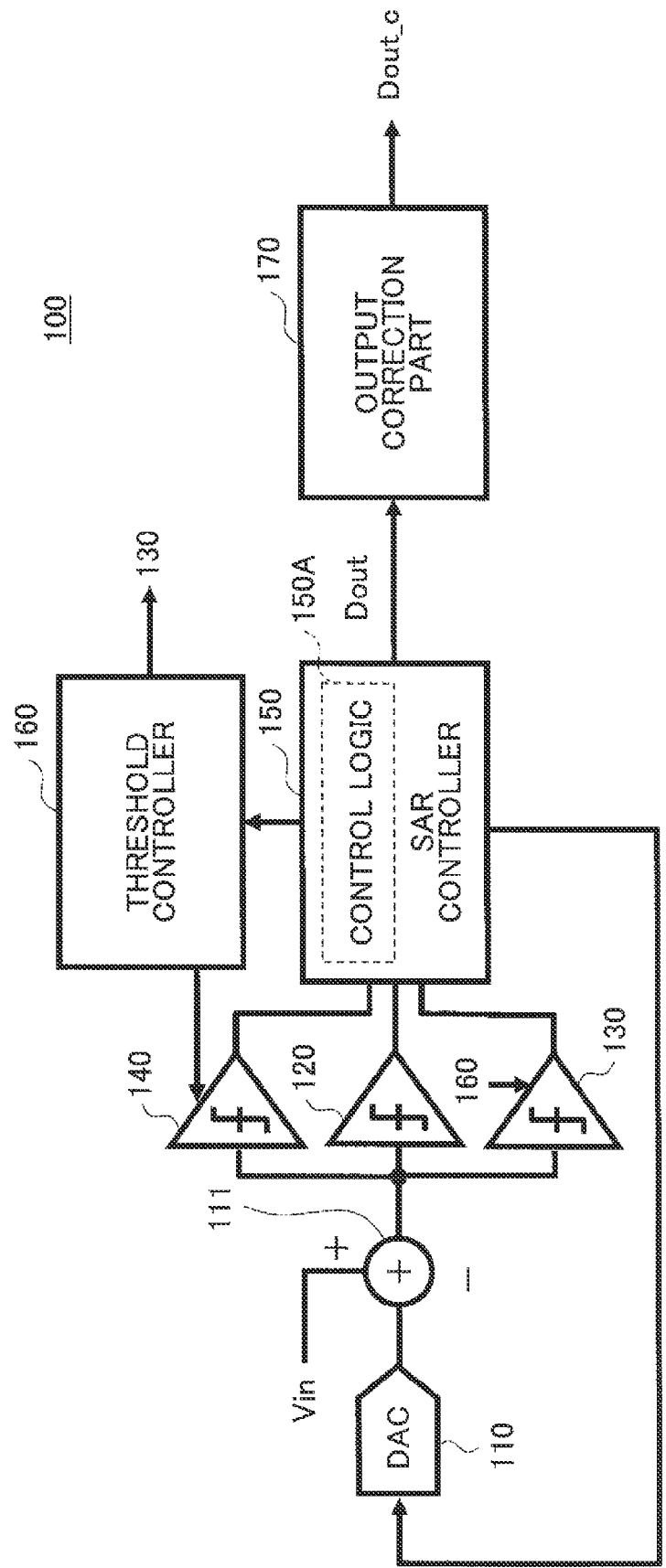
FIG. 2 is a diagram illustrating the AC converter 100 according to the first embodiment.

Preferred embodiments of the present invention will be described with reference to the accompanying drawings. Those parts and the like that are the same are designated by the same reference numerals, and a description thereof will be omitted.

First Embodiment

FIGS. 1A and 1B are diagrams illustrating a mobile phone terminal 500 including an analog-to-digital (AC) converter 100 according to a first embodiment. FIG. 1A is a perspective diagram of the mobile phone terminal 500, and FIG. 1B is a diagram illustrating a substrate 504 of the mobile phone terminal 500.

As illustrated in FIG. 1A, a display part 502 and an operating part 503 are disposed on an outer surface of a housing 501 of the mobile phone terminal 500, and the substrate 504 indicated by a broken line is disposed inside the housing 501.

Note that the mobile phone terminal 500 is an example of an electronic apparatus, and the substrate 504 is an example of a circuit board.

The housing 501 is made of resin or metal, and includes respective openings for disposing the display part 502 and the operating part 503. The display part 502 may be a liquid crystal panel capable of displaying characters, numerals, images and the like. The operating part 503 includes various selection keys for selecting various functions of the mobile phone terminal 500 in addition to a numeric keypad. Note that the mobile phone terminal 500 may include a proximity communication device (e.g., infrared communication device and an electronic money communication device) or accessories such as a camera.

In addition, the substrate 504 illustrated in FIG. 1B may be an FR4 (a woven fiber glass-reinforced epoxy laminate substrate), and include wiring part 505 formed by patterning a copper foil on a surface 504A of the substrate 504. The wiring part 505 serves as a transmission route to transmit various signals that are required for driving the electronic apparatus. The wiring part 505 may be patterned by etching with a resist.

Note that FIG. 1B illustrates the wiring part 505 formed on the surface 504A of the substrate 504. However, the substrate 504 is a laminated substrate having plural wiring parts, and hence, includes a power source wiring part disposed in inner layers of the substrate 504.

The substrate 504 implements an antenna 511 required for performing communications such as making a phone call for a user to talk over the mobile phone terminal 500, an RF (radio frequency) communication part 512, an analog-to-digital (AD) converter 100, a baseband processor 513, and a CPU (central processing unit) chip 514.

The antenna 511, the RF communication part 512, the AD converter 100, and the baseband processor 513 may be connected to the wiring part 505 with solder balls to be implemented on the substrate 504.

Phone call signals received by the antenna 511 are, after performing a filtering process in the RF communication part 512, converted by the AD converter 100 into digital signals. The digital signals output from the AD converter are, after performing a baseband process in the baseband processor 513, output as sound from a not-illustrated speaker via the CPU chip 514.

The FR4 used as the substrate 504 generally includes stacked plural insulating layers, and a copper foil pattern is formed on each of interfaces between adjoining insulating layers (i.e., each interlayer between the insulating layers) of the stacked structure, and a top surface and a bottom surface of the stacked structure.

In addition, the substrate 504 may be any substrate other than the FR4 insofar as the substrate is a dielectric substrate capable of having the wiring part 505 formed on it and capable of having a circuit board installed.

The wiring part 505 may be formed of any metallic material (e.g., aluminum (Al)) other than copper (Cu) insofar as the metallic material exhibits small power loss and has high electric conductivity.

Note that FIG. 1 illustrated the mobile phone terminal 500 as an example of the electronic apparatus; however, the electronic apparatus may not be limited to the mobile phone terminal 500. The electronic apparatus may be any communication terminal such as a smart phone terminal and a digital terrestrial Television broadcasting tuner. Alternatively, the electronic apparatus may be a PC (personal computer) or a server.

FIG. 2 is a diagram illustrating the AC converter 100 according to the first embodiment.

The AD converter 100 includes a DAC (digital-to-analog converter) 110, an adder 111, a comparator 120, auxiliary comparators 130 and 140, an SAR (successive-approximation register) controller 150, a threshold controller 160, and an output correction part 170.

Note that the AD converter 100 is illustrated as a single-end configuration unless otherwise specified; however, the AD converter 100 may have a single-ended input configuration; however, the AD converter 100 may have a differential input configuration.

The DAC 110 includes a capacitor of a predetermined number of bits, and the adder 111. The DAC 110 is configured to output analog signals obtained by converting digital signals retained by the capacitor into analog signals. The DAC 110 is an example of a DA (digital-to-analog) converting part.

The adder 111 is configured to receive the analog signals converted from the digital signals retained by the capacitor and an input voltage Vin of the AD converter 100. The adder 111 is configured to output a signal obtained by subtracting the input voltage Vin from an output of the DAC 110. In this embodiment, the output of the adder 111 is illustrated as a residual signal of the DAC 110.

Note that in the configuration of the first embodiment illustrated below, the DAC 110 includes the adder 111, the input voltage Vin is input to the adder 111, and the output of the adder 111 is treated as a residual signal of the DAC 110. The configuration of the first embodiment may exclude the adder 111. However, operations of the AD converter 100 may remain unchanged when the analog signals output from the DAC 110 are supplied to the comparator 120 and the auxiliary comparators 130 and 140 by utilizing the input voltage Vin as a comparative reference voltage of the comparator 120 and the auxiliary comparators 130 and 140. In this case, the DAC 110 is configured to output an analog signal instead of outputting a residual signal.

The comparator 120 is configured to compare the residual signal output from the DAC 110 and the input voltage Vin, and input a binary signal (i.e., a digital signal) representing a compared result into the SAR controller 150.

The digital signal output from the comparator 120 represents a conversion value of each bit retained in the DAC 110. An example of the comparator 120 includes an ADC (analog-to-digital converter).

The comparator 120 serves as a main comparator corresponding to the auxiliary comparators 130 and 140. The comparator 120 is an example of the main comparator. The relationship between the comparator 120 and the auxiliary comparators 130 and 140 will be described later.

The auxiliary comparators 130 and 140 are configured to compare the residual signal output from the DAC 110 and a predetermined reference level (in this case, the input voltage Vin), and input a binary signal (i.e., a digital signal) representing a compared result into the SAR controller 150 in a manner similar to the comparator 120. The auxiliary comparators 130 and 140 are examples of sub-comparators. More specifically, the auxiliary comparator 130 is an example of a first sub-comparator and the auxiliary comparator 140 is an example of a second sub-comparator.

The digital signals output from the auxiliary comparators 130 and 140 represent conversion values of respective bits retained in the DAC 110. Examples of the auxiliary comparators 130 and 140 may include an ADC (analog-to-digital converter).

The auxiliary comparator 130 has a negative offset that is less than a quantization unit of the DAC 100 (the least significant bit (LSB) i.e., less than 1 LSB) with respect to the comparator 120. In the first embodiment, the offset of the auxiliary comparator 130 with respect to the comparator 120 is −0.5 LSB.

The auxiliary comparator 140 has a positive offset that is less than the quantization unit of the DAC 100 (the least significant bit (LSB); i.e., less than 1 LSB) with respect to the comparator 120. In the first embodiment, the offset of the auxiliary comparator 140 with respect to the comparator 120 is +0.5 LSB.

The SAR controller 150 includes a register, and is configured to retain the digital signal input from the comparator 120 in the register while inputting the digital signal into the DAC 110. Further, the SAR controller 150 is configured to output a digital signal Dout formed of the digital signal input from the comparator. The access controller 150 is an example of a successive approximation controller.

Further, the SAR controller 150 is configured to receive digital signals (binary signals) representing determination results of the auxiliary comparators 130 and 140.

The threshold controller 160 is configured to generate a threshold control signal based on the digital signals representing the determination results of the auxiliary comparators 130 and 140 supplied from a control logic 150A inside the SAR controller 150 so as to control the auxiliary comparators 130 and 140 based on the threshold signal. The thresholds of the auxiliary comparators 130 and 140 are offsets corresponding to a threshold of the comparator 120. Hence, the threshold controller 160 is an example of an offset controller.

The threshold controller 160 includes counters for counting the digital signals of the auxiliary comparators 130 and 140. Note that threshold controls by the threshold controller 160 are described later.

An output correction part 170 is configured to correct the digital signal Dout output from the SAR controller 150 based on an error of each bit input from the SAR controller 150 so as to output a digital signal Dout_c. The error of each bit input from the SAR controller 150 is computed based on a DNL (differential non-linearity error) of the error obtained from the digital signals output from the auxiliary comparators 130 and 140. The correction of the digital signal Dout performed by the output correction part 170 is described later with reference to FIG. 12.

The AD converter 100 is configured to make a residual error asymptotically approaching zero while sequentially determining a conversion value of each bit from higher-order bits of the DAC 110. The AD converter 100 is further configured to cause the comparator 120 to determine a conversion value, retain the determined conversion value per bit in the SAR controller 150, and input the determined conversion value into the DAC 110 for determining a next conversion value.

The above operation is repeated for a predetermined number of bits of the DAC 110 so that the conversion value for a predetermined number of bits is determined. For example, when a predetermined number of bits is four (bits), the operation for determining the above conversion value is repeated four times. As a result, the conversion value of four bits is determined.

Figure 3:
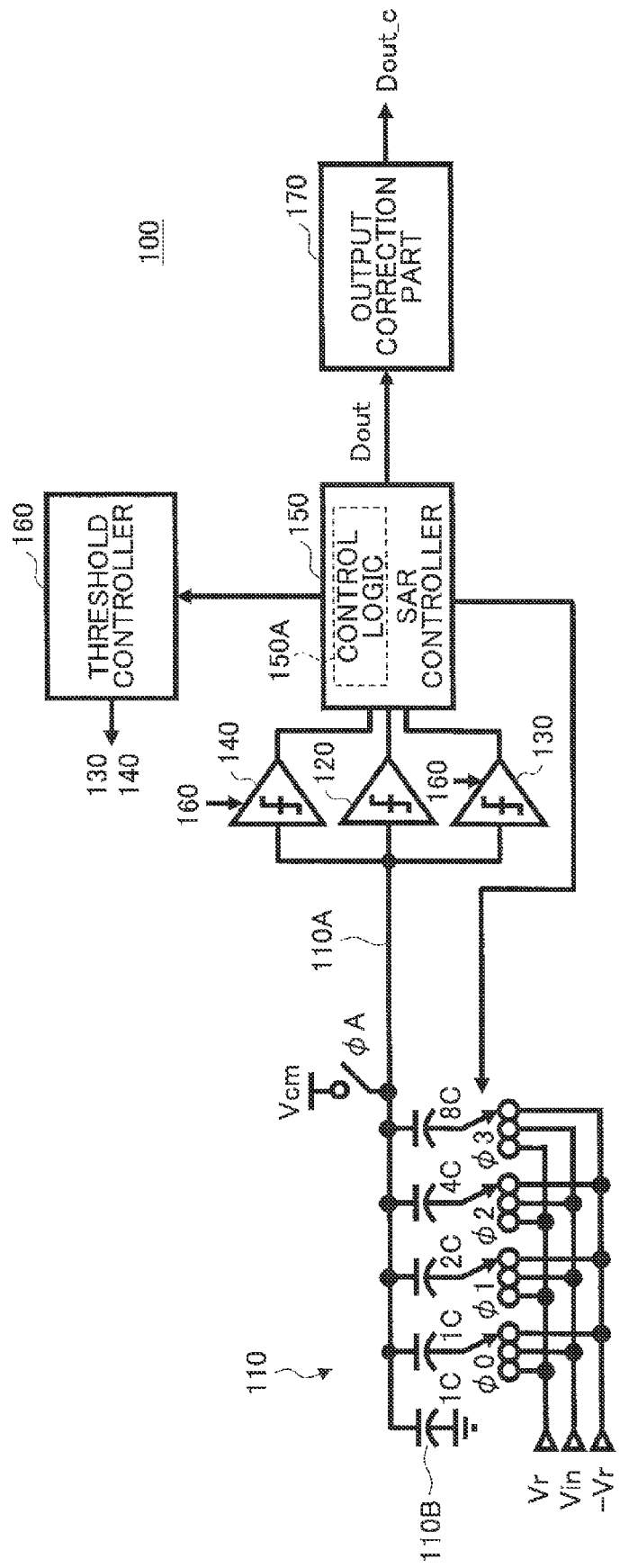
FIG. 3 is a diagram illustrating the AC converter 100 according to the first embodiment.

FIG. 3 is a diagram illustrating the AC converter 100 according to the first embodiment. FIG. 3 specifically illustrates a detailed internal configuration of the DAC 110. Note that the AD converter 100 is similar to the AD converter 100 illustrated in FIG. 2 except for the DAC 110. In FIG. 3, the DAC 110 is formed for signals of four bits, the digital signal Dout output from the comparator 120 is formed of digital signals DU3, DU2, DU1, and DU0 of four bits.

The DAC 110 has a 4-bit capacitor DAC, and includes 16 capacitors C. The 16 capacitors C all have an identical electrostatic capacitance, and are connected in parallel with one another with respect to an output part 110A of the DAC 110. Note that FIG. 3 illustrates a configuration of the DAC 110 including the adder 111 illustrated in FIG. 2.

The 16 capacitors C are aligned in a 4-bit binary weight system, and are divided into a total number of five groups, that is, eight capacitors (8C), four capacitors (4C), one capacitor C, and one capacitor C.

In FIG. 3, the eight capacitors C at the highest order bit are represented by a reference numeral for one capacitor "8C", the four capacitors C at one bit below the highest order bit are represented by a reference numeral for one capacitor "4C", and the two capacitors C at one bit below the third highest order bit are represented by a reference numeral for one capacitor "2C" for facilitating viewability of the circuit configuration.

One end (i.e., a first end) of the capacitor 8C at the highest order bit (i.e., a terminal illustrated at a lower part of FIG. 3) is connected to a switch φ3. The switch φ3 is connected to the first end of the capacitor 8C. Further, the other end (i.e., a second end) of the capacitor 8C (i.e., a terminal illustrated at an upper part of FIG. 3) is connected to the output part 110A.

The switch φ3 is configured to select one of three terminals as a connecting destination to the first end of the capacitor 8C, so that the selected terminal is connected to the first end of the capacitor 8C. The switch φ3 is configured to connect to the capacitor 8C one of the three terminals which are a terminal of a reference voltage +Vr, a terminal of the input voltage Vin, and a terminal of a reference voltage −Vr.

When the input voltage Vin is input to the capacitor 8C, the switch φ3 selects the terminal of the input voltage Vin. Further, when DA conversion for determining a value of a digital signal DU3 is performed, the switch φ3 selects the terminal of the reference voltage +Vr.

Moreover, the switch φ3 is selectively connected to one of the terminals of the reference voltages +Vr and −Vr according to the value of the digital signal DU3 that is a determination result of the comparator 120.

When the digital signal DU3 is "0", the SAR controller 150 connects the switch φ3 to the terminal of the reference voltage +Vr, whereas when the digital signal DU3 is "1", the SAR controller 150 connects the switch φ3 to the terminal of the reference voltage −Vr.

Note that the switch φ3 is connected to each of the eight capacitors C connected in parallel with one another that are represented by one capacitor 8C.

One end (i.e., a first end) of the capacitor 4C located at the second bit from the highest order bit (i.e., a terminal illustrated at the lower part of FIG. 3) is connected to a switch φ2. The switch φ2 is connected to the first end of the capacitor 4C. Further, the other end (i.e., a second end) of the capacitor 4C (i.e., a terminal illustrated at the upper part of FIG. 3) is connected to the output part 110A.

The switch φ2 is configured to select one of three terminals as a connecting destination to the first end of the capacitor 4C, so that the selected terminal is connected to the first end of the capacitor 4C. The switch φ2 is configured to connect to the capacitor 4C one of the three terminals which are the terminal of the reference voltage +Vr, the terminal of the input voltage Vin, and the terminal of the reference voltage −Vr.

When the input voltage Vin is input to the capacitor 4C, the switch φ2 selects the terminal of the input voltage Vin. Further, when DA conversion for determining a value of a digital signal DU2 is performed, the switch φ2 selects the terminal of the reference voltage +Vr.

Moreover, the switch φ2 is selectively connected to one of the terminals of the reference voltages +Vr and −Vr according to the value of the digital signal DU2 that is a determination result of the comparator 120.

When the digital signal DU2 is "0", the SAR controller 150 connects the switch φ2 to the terminal of the reference voltage +Vr, whereas when the digital signal DU2 is "1", the SAR controller 150 connects the switch φ2 to the terminal of the reference voltage −Vr.

Note that the switch φ2 is connected to each of the four capacitors C mutually connected in parallel with one another that are represented by one capacitor 4C.

One end (i.e., a first end) of the capacitor 2C located at the third bit from the highest order bit (i.e., a terminal illustrated at the lower part of FIG. 3) is connected to a switch φ1. The switch φ1 is connected to the first end of the capacitor 2C. Further, the other end (i.e., a second end) of the capacitor 2C (i.e., a terminal illustrated at the upper part of FIG. 3) is connected to the output part 110A.

The switch φ1 is configured to select one of three terminals as a connecting destination to the first end of the capacitor 2C, so that the selected terminal is connected to the first end of the capacitor 2C. The switch φ1 is configured to select one of the three terminals which are the terminal of the reference voltage +Vr, the terminal of the input voltage Vin, and the terminal of the reference voltage −Vr, and connect the selected terminal to the capacitor 2C.

When the input voltage Vin is input to the capacitor 2C, the switch φ1 selects the terminal of the input voltage Vin. Further, when DA conversion for determining a value of a digital signal DU1 is performed, the switch φ1 selects the terminal of the reference voltage +Vr.

Moreover, the switch φ1 is selectively connected to one of the terminals of the reference voltages +Vr and −Vr according to the value of the digital signal DU1 that is a determination result of the comparator 120.

When the digital signal DU1 is "0", the SAR controller 150 connects the switch φ1 to the terminal of the reference voltage +Vr, whereas when the digital signal DU1 is "1", the SAR controller 150 connects the switch φ1 to the terminal of the reference voltage −Vr.

Note that the switch φ1 is connected to each of the two capacitors C connected in parallel with each other that are represented by one capacitor 2C.

One end (i.e., a first end) of the capacitor 1C located at the fourth bit from the highest order bit (i.e., a terminal illustrated at the lower part of FIG. 4) is connected to a switch φ0. The switch φ0 is connected to the first end of the capacitor 1C. Further, the other end (i.e., a second end) of the capacitor 1C (i.e., a terminal illustrated at the upper part of FIG. 3) is connected to the output part 110A.

The switch φ0 is configured to select one of three terminals as a connecting destination to the first end of the capacitor 1C, so that the selected terminal is connected to the first end of the capacitor 1C. The switch φ0 is configured to select one of the three terminals which are the terminal of the reference voltage +Vr, the terminal of the input voltage Vin, and the terminal of the reference voltage −Vr, and connect the selected terminal to the capacitor 1C.

When the input voltage Vin is input to the capacitor 1C, the switch φ0 selects the terminal of the input voltage Vin. Further, when DA conversion for determining a value of a digital signal DU0 is performed, the switch φ0 selects the terminal of the reference voltage +Vr.

Moreover, the switch φ0 is selectively connected to one of the terminals of the reference voltages +Vr and −Vr to the capacitor 1C according to the value of the digital signal DU0 that is a determination result of the comparator 120.

When the digital signal DU0 is "0", the SAR controller 150 connects the switch φ0 to the terminal of the reference voltage +Vr, whereas when the digital signal DU0 is "1", the SAR controller 150 connects the switch φ0 to the terminal of the reference voltage −Vr.

A capacitor C indicated by a reference numeral 110B in FIG. 3 is one capacitor C similar to a capacitor C located at the lowest order bit. One end (i.e., a first end) of the capacitor C indicated by the reference numeral 110B (i.e., a terminal illustrated at the lower part of FIG. 3) is grounded. Further, the other end (i.e., a second end) of the capacitor C indicated by the reference numeral 110B (i.e., a terminal illustrated at the upper part of FIG. 3) is connected to the output part 110A.

As described earlier, the 16 capacitors C are aligned in the 4-bit binary weight system.

The capacitor C indicated by the reference numeral 110B is a remaining one of the 16 capacitors C obtained by excluding from the 16 capacitors the total number of 15 capacitors, which include the eight capacitors (the capacitor 8C) at the highest order bit, the four capacitors (the capacitor 4C) at the second bit from the highest order bit, the two capacitors (the capacitor 2C) at the third bit from the highest order bit, and one capacitor (the capacitor 1C) at the lowest order bit.

The capacitor C indicated by the reference numeral 110B is disposed for balancing electric charges within the DAC 110 when acquiring the digital signals DU3, DU2, DU1, and DU0 of the four bits.

Note that the switch φA is configured to maintain the other ends (i.e., second ends) of the 16 capacitors 8C, 4C, 2C, C, and C at a predetermined voltage. The switch φA is branched and disposed between the 16 capacitors 8C, 4C, 2C, C, and C, and the output part 110A. The switch φA is connected to a power supply having a voltage value Vcm. Note that the voltage value Vcm in this embodiment is 0 V.

The DAC 110 having the above configuration outputs a residual signal representing the final residual error, which is obtained by converting a 4-bit digital code determined based on values of the digital signals DU3, DU2, DU1, and DU0 into an analog signal. The residual signal representing the final error of the DAC 110 is output as a voltage of the output part 110A of the DAC 110 when the values of the digital signals DU3, DU2, DU1, and DU0 are determined.

The comparator 120 compares the voltage (i.e., the voltage of the output part 110A of the DAC) of the residual signal output from the DAC 110 and the predetermined reference level (i.e., the input voltage Vin), and outputs the digital signals DU3, DU2, DU1, and DU0 representing the compared result. The digital signals DU3, DU2, DU1, and DU0 represent respective bits of the 4-bit digital signal Dout.

In the DAC 110 having the above configuration, the capacitors 8C, 4C, 2C, C, and C are disposed in a 4-bit binary weight system. Each of the capacitors is an example of a converting phase, and the DAC 110 has capacitors corresponding to four bits (16 gradations).

Note that the DAC 110 formed for signals of four bits is illustrated in this embodiment for convenience of explanation; however, the number of bits for the signals of the DAC 110 is not limited to four bits, and may be greater than four bits. For example, when the number of bits for the signals of the DAC 110 is 10 bits, the DAC 110 has capacitors for 1024 gradations.

Note that this embodiment describes a configuration having the DAC 110 as an example of a DA (digital-to-analog) converting part. However, the DA converting part may not be limited to the DAC 110. The DA converting part may have a predetermined number of gradation converting stages, and output the residual signal obtained by the gradation converting stages converting the digital signals into analog signals. The DA converting part may utilize a resistor as the gradation converting phase. The resistor may be combined with a capacitor.

Note that the auxiliary comparators 130 and 140 are configured to generate errors for correcting the digital signal Dout. Hence, the auxiliary comparators 130 and 140 may be switched off in a normal state where a process for generating errors is not conducted; that is, where the AD converter 100 performs a normal AD conversion process based on the determination result produced by the comparator 120. To switch the auxiliary comparators 130 and 140 off, the SAR controller 150 may stop controlling the operational clock for the auxiliary comparators 130 and 140.

Next, operations of the DAC 110 of the AC converter 100 according to the first embodiment are described with reference to FIG. 4.

Figure 4:
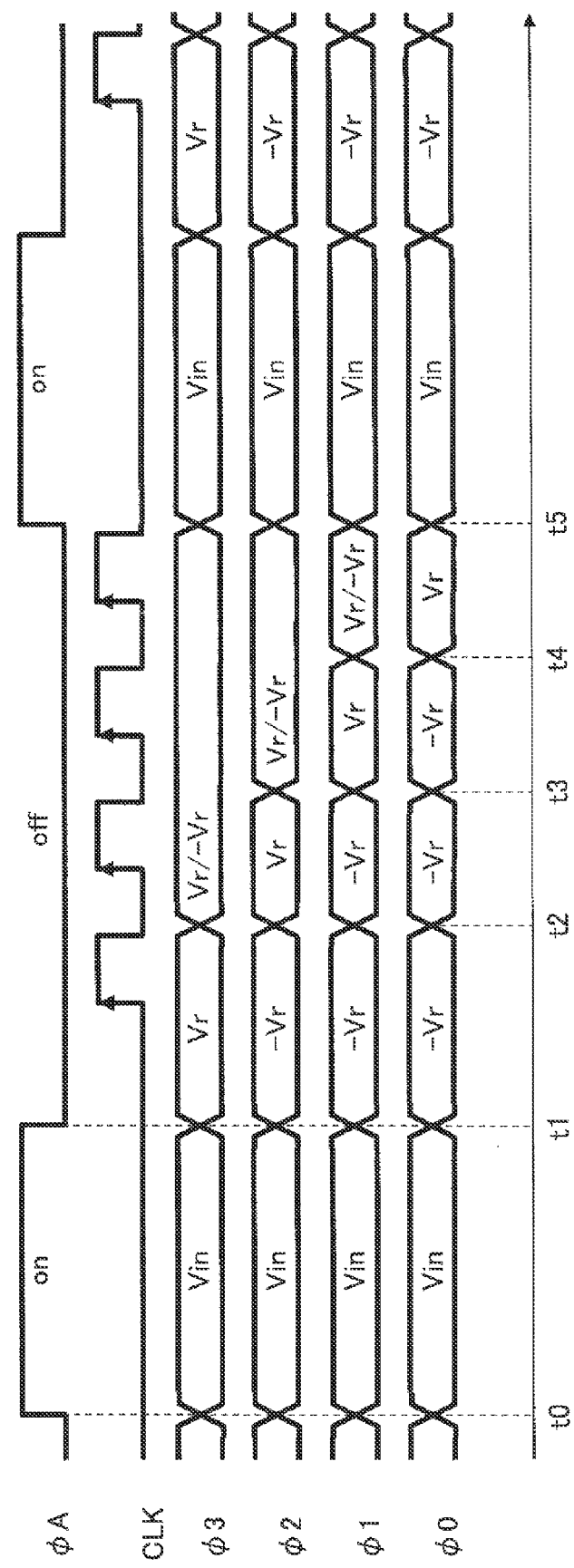
FIG. 4 is a timing chart illustrating operations of the AC converter 100 according to the first embodiment.

FIG. 4 is a timing chart illustrating the operations of the AC converter 100 according to the first embodiment. In this embodiment, the operations of the AD converter 100 according to the output of the comparator 120 are described for convenience of explanation.

In FIG. 4, the clock CLK input to the switches φA, φ3, φ2, φ1 and φ0, and the comparator 120 is illustrated. Note that the switching of the switches φA, φ3, φ2, φ1 and φ0 is performed by the SAR controller 150.

Initially, the switch φA is turned on at a time t0, and the switches φ3, φ2, φ1 and φ0 are connected to the terminal of the input voltage Vin. Hence, the first ends of all the capacitors 8C, 4C, 2C, and C (see the terminals at the lower part of FIG. 3) retain the input voltage Vin. Thus, the capacitors 8C, 4C, 2C, and C sample electric charges based on the input voltage Vin.

Note that the electric charge Q0 appearing at each of one ends (i.e., each of first ends/illustrated as the terminals at the lower part of FIG. 3) of all the capacitors 8C, 4C, 2C and C is expressed as the following formula.

$$Q0 = 15C(Vin-Vcm) + 1C(0-Vcm)$$

Note that in the above formula, "1C(0−Vcm)" on the right-hand side indicates the term computing the electric charge on the capacitor indicated by the reference numeral 110B. Further, according to the above formula, Vcm=0 V. Hence, the electric charge Q0 appearing at each of the first ends (the terminals at the lower part of FIG. 3) of all the capacitors 8C, 4C, 2C and C is Q0=15C (Vin).

Next, at time t1, the switch φA is turned off, the switch φ3 is connected the terminal of the reference voltage +Vr, and the switches φ2, φ1, and φ0 are connected to the terminal of the reference voltage −Vr. At this moment, the comparator 120 outputs the digital signal DU3 representing a compared result obtained by comparing the voltage of the output part 110A and the reference level (Vin (V)).

In this case, when "V'" represents the output voltage of the output part 110A, the electric charge Q1 appearing at each of the first ends (the terminals at the lower part of FIG. 3) is Q1=8C(Vr−V')+7C(−Vr−V')+1C(0−V')=CVr−16C (V').

Since Q0=Q1 according to the law of conservation of charge, V'=−($^{15}/_{16}$)×(Vin−Vr/15). Subsequent output voltages (the voltage representing the residual signal) of the output part 110A will be determined in a similar manner as the above.

Next, at time t2, the switch φ3 is selectively connected to one of the terminals of the reference voltages +Vr and −Vr according to the value of the digital signal DU3 determined between times t1 and t2. Further, the switch φ2 is connected to the terminal of the reference voltage +Vr, and the switches φ1 and φ0 are connected to the terminal of the reference voltage −Vr. At this moment, the comparator 120 outputs the digital signal DU2 representing a compared result obtained by comparing the voltage of the output part 110A and the reference level (Vin (V)).

Next, at time t3, the switch φ3 is selectively connected to one of the terminals of the reference voltages +Vr and −Vr according to the value of the digital signal DU3 determined between times t1 and t2. Further, the switch φ2 is selectively connected to one of the terminals of the reference voltages +Vr and −Vr according to the value of the digital signal DU2 determined between times t2 and t3.

In addition, the switch φ1 is connected to the terminal of the reference voltage +Vr, and the switch φ0 is connected to the terminal of the reference voltage −Vr. At this moment, the comparator 120 outputs the digital signal DU1 representing a compared result obtained by comparing the voltage of the output part 110A and the reference level (Vin (V)).

Next, at time t4, the switch φ3 is selectively connected to one of the terminals of the reference voltages +Vr and −Vr according to the value of the digital signal DU3 determined between times t1 and t2. Further, the switch φ2 is selectively connected to one of the terminals of the reference voltages +Vr and −Vr according to the value of the digital signal DU2 determined between times t2 and t3.

In addition, the switch φ1 is selectively connected to one of the terminals of the reference voltages +Vr and −Vr according to the value of the digital signal DU1 determined between times t3 and t4.

Moreover, the switch φ0 is connected to the terminal of the reference voltage +Vr. At this moment, the comparator 120 outputs the digital signal DU0 representing a compared result obtained by comparing the voltage of the output part 110A and the reference level (Vin (V)). Note that next sampling is performed from time t5 onward.

As described above, the 4-bit digital signal Dout represented by the digital signals DU3, DU2, DU1, and DU0 is acquired.

FIG. 5 is a diagram illustrating a change in a reference voltage (i.e., the output voltage of the output part 110A of the DAC 110) of the comparator 120 with time while the AD converter 100 according to the first embodiment performs AD conversion, and the digital signals DU3, DU2, DU1, and DU0. Times t1 to t5 illustrated in FIG. 5 correspond to times t1 to t5 illustrated in FIG. 4. Note that an input voltage of the comparator 120 is represented by Vin.

In FIG. 5, the operations of the AD converter 100 according to the output of the comparator 120 are described for convenience of explanation in a manner similar to the case illustrated in FIG. 4.

In FIG. 5, the reference voltage of the comparator 120 is represented by the reference voltage +Vr of the AD converter 100. Since the AD converter 100 according to the first embodiment includes four bits, 16 gradations (i.e., '0' to '15' gradations) between the reference voltages −Vr and +Vr are expressed on the vertical axis. Note that 1 LSB of the AD converter 100 is Vr/8. Further, in the following description, the voltage of the 16 gradations is represented by Vr0 to Vr15.

As described above, the comparator 120 outputs the digital signal DU3 (='0') between times t1 and t2 by switching between the switches φ3, φ2, φ1, and φ0. This is because the input voltage Vin of the comparator 120 is lower than the reference voltage Vr.

Further, the comparator 120 outputs the digital signal DU2 (='1') between times t2 and t3. This is because the input voltage Vin of the comparator 120 is higher than the reference voltage Vr4.

Further, the comparator 120 outputs the digital signal DU1 (='0') between times t3 and t4. This is because the input voltage Vin of the comparator 120 is lower than the reference voltage Vr6.

Further, the comparator 120 outputs the digital signal DU0 (='0') between times t4 and t5. This is because the input voltage Vin of the comparator 120 is lower than the reference voltage Vr5.

As described above, the output voltage of the output part 110A of the DAC (i.e., the reference voltage of the comparator 120) approaches asymptotically to the input voltage Vin as illustrated in FIG. 5, thereby acquiring the digital signals DU3, DU2, DU1, and DU0.

The digital signals DU3, DU2, DU1, and DU0 represent respective bits of the 4-bit digital signal Dout output by the SAR controller 150 after the AD conversion performed by the comparator 120.

In FIG. 5, the input voltage Vin resides between Vr4 and Vr5 when the digital signal DU0 is finally acquired. The voltage difference between the input voltage Vin and Vr5 represents a quantization error.

Further, the final step is defined as the step of acquiring the digital signal DU0, among respective steps of acquiring the digital signals DU3, DU2, DU1, and DU0.

Next, the auxiliary comparator 130 is illustrated with reference to FIG. 6.

FIG. 6 is a diagram illustrating an operational relationship between the comparator 120 and the auxiliary comparator 130 in the AD convertor 100 according to the first embodiment. In FIG. 6, (A) is a diagram illustrating a part of FIG. 5, and (B) is a diagram illustrating a part close to the reference voltages Vr4 and Vr5 of (A) enlarged in the vertical axis direction.

In (B) of FIG. 6, the comparator 120 and the auxiliary comparator 130 are schematically illustrated in order to illustrate the reference voltages of the comparator 120 and the auxiliary comparator 130 when the digital signals DU2 and DU0 are acquired.

Numeric values on the vertical axis in (B) of FIG. 6 indicate the voltage difference between the reference voltages Vr4 and Vr5 per LSB. Further, numeric values illustrated on the input side of the comparator 120 and the auxiliary comparator 130 indicate offset amounts corresponding to the reference voltage of the comparator 120. In addition, numeric values illustrated on the output side of the comparator 120 and the auxiliary comparator 130 indicate values of the digital signal DU(N) of the comparator 120 and the digital signal of the comparator 120.

In the following, the digital signal is simply and generically expressed as the digital signal DU(N) without differentiating between the digital signals DU3, DU2, DU1, and DU0. N represents a natural number including 0.

The AD converter 100 according to the first embodiment is a 4-bit AD converter including the 4-bit DAC 110. 1 LSB of the 4-bit DAC 110 is represented by Vr/8 when the reference voltages of the DAC 110 are +Vr and −Vr. The DAC 110 will not perform DA (digital-to-analog) conversion on the values less than Vr/8.

When the value of the digital signal DU(N) is changed from '1' to '0' or changed from '0' to '1', the output voltage of the DAC 110 (the reference voltage of the comparator 120) may have skipped the input voltage Vin.

For example, similar to the digital signals DU2 and DU0 illustrated in (A) of FIG. 6, when the value of the digital signal DU(N) is changed from '1' to '0', the input voltage Vin resides between the reference voltage Vr4 of the comparator 120 when the digital signal DU2 is acquired and the reference voltage Vr5 of the comparator 120 when the digital signal DU0 is acquired.

Figure 8:
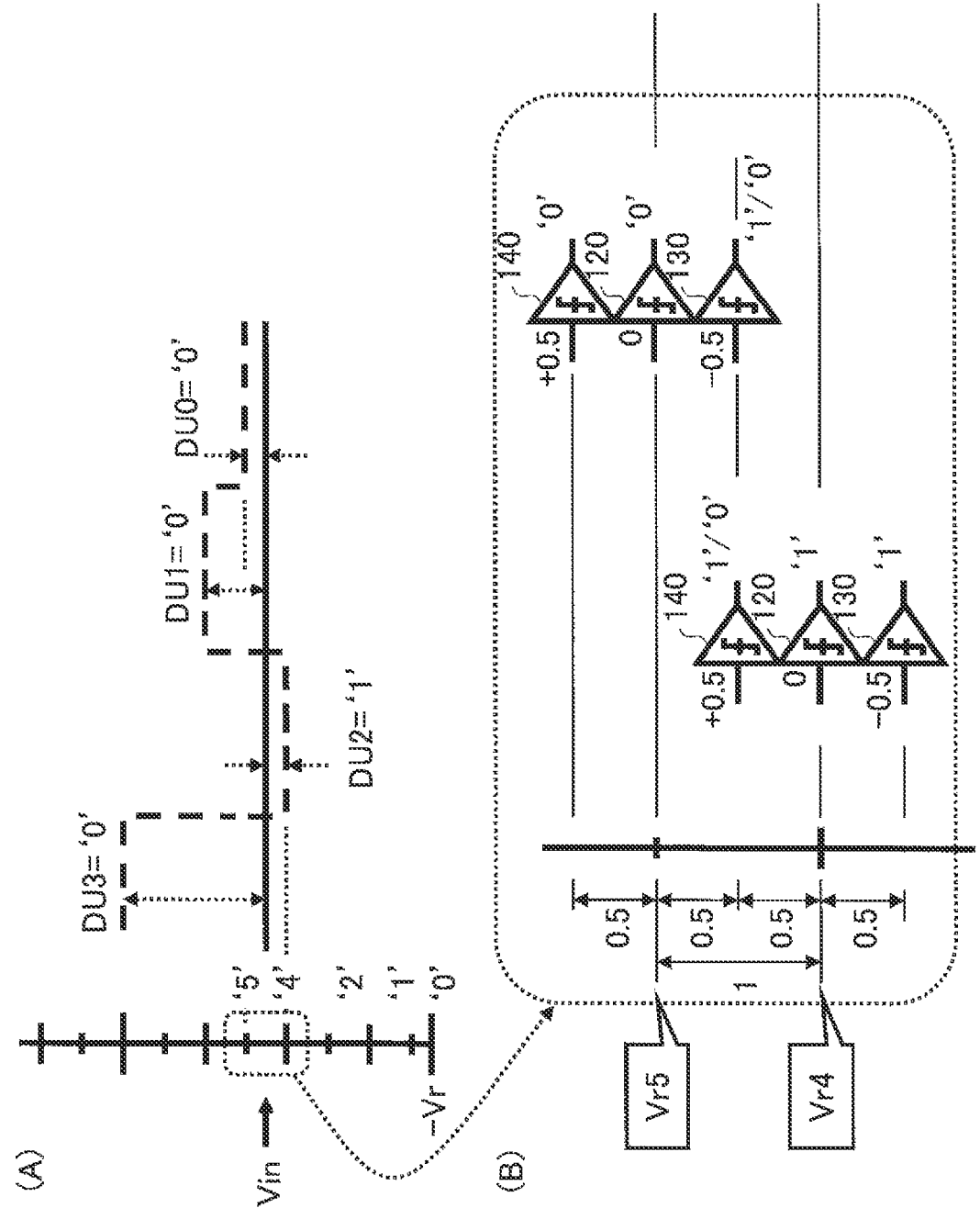
FIG. 8 is a diagram illustrating operating examples of the comparator 120, and auxiliary comparators 130 and 140 in the AD converter 100 according to the first embodiment.

Note that a case similar to the above is observed in the digital signals DU2 and DU1 (='0') illustrated in (A) of FIG. 8. However, the reference voltage of the comparator 120 is closer to the input voltage Vin when the digital signal DU0 is acquired than when the digital signal DU1 is acquired. Hence, a case in which the digital signals DU2 and DU0 are acquired is illustrated below.

Note that when the digital signal DU2 of the comparator 120 is switched to '1', the digital signal of the auxiliary comparator 130 is switched to '1'. This is because the auxiliary comparator 130 has an offset of −0.5 LSB with respect to the comparator 120. In this case, when the reference voltage of the comparator 120 is Vr4 that is lower than the input voltage Vin of the DAC 110, the reference voltage of the auxiliary comparator 130 is also lower than the input voltage Vin.

On the other hand, when the digital signal DU0 of the comparator 120 is switched to '0', the digital signal of the auxiliary comparator 130 is switched to '1' or '0'. This is because the auxiliary comparator 130 has an offset of −0.5 LSB with respect to the comparator 120. In this case, when the reference voltage of the comparator 120 is Vr5 that is higher than the input voltage Vin of the DAC 110, the reference voltage of the auxiliary comparator 130 may be either higher or lower than the input voltage Vin.

Similarly, when the digital signal DU(N) of the comparator 120 is changed from '0' to '1', and the digital signal DU0 is switched to '0', the digital signal of the auxiliary comparator 130 is switched to '1' or '0'.

As described above, the gradations less than 1 LSB of the DAC 110 may be detected by utilizing the auxiliary comparator 130.

Note that when the output of the DAC 110 has no error, the voltage difference between the reference voltages Vr4 and Vr5 is 1 LSB (i.e., Vr/8), the auxiliary comparator 130 has −0.5 LSB offset with respect to the comparator 120. Hence, when the digital signal of the auxiliary comparator 130 is capable of taking any one of the values '1' and '0', the probability of the digital signal of the auxiliary comparator 130 being switched to '1' and the probability of the digital signal of the auxiliary comparator 130 being switched to '0' may be 50% and 50%, respectively.

Note that the auxiliary comparator 140 has +0.5 LSB offset with respect to the comparator 120. Hence, as illustrated in (B) of FIG. 8, when the comparator 120 outputs the digital signal DU2='1', the comparator 140 outputs the digital signal of '1' or '0'. Further, as illustrated in (B) of FIG. 8, when the comparator 120 outputs the digital signal DU2='0', the comparator 140 outputs the digital signal of '0'.

Hence, when the output of the DAC 110 has no error, and the digital signal of the auxiliary comparator 140 is capable of taking any one of the values '1' and '0', the probability of the digital signal of the auxiliary comparator 140 being switched to '1' and the probability of the digital signal of the auxiliary comparator 140 being switched to '0' may be 50% and 50%, respectively.

Next, the probability that the auxiliary comparator 130 determining either '1' or '0' is illustrated with reference to FIGS. 7A to 7C.

Figure 7C:
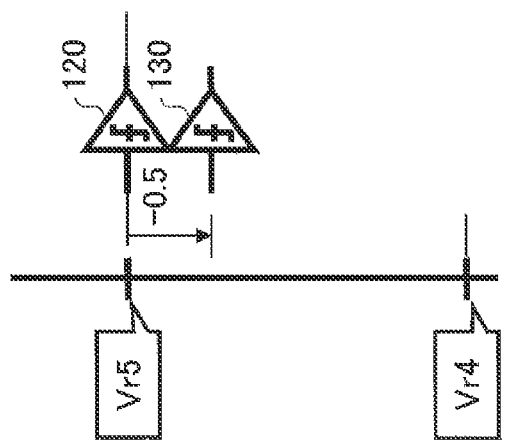
FIGS. 7A through 7C are diagrams illustrating the probability of the auxiliary comparator 130 in the AD converter 100 according to the first embodiment determining either "1" or "2"
Figure 7B:
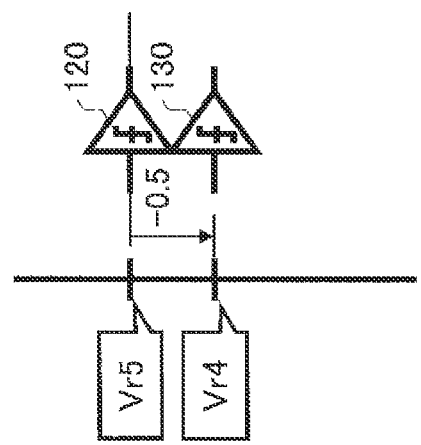
Figure 7A:
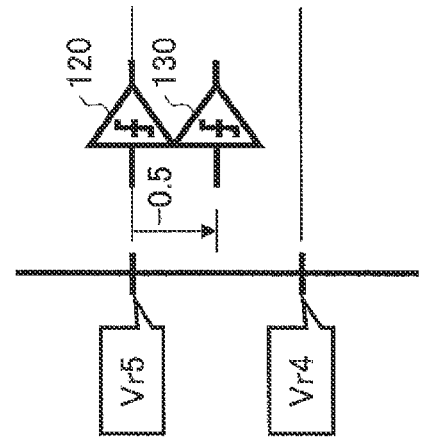

FIGS. 7A through 7C are diagrams illustrating the probability of the auxiliary comparator 130 in the AD converter 100 according to the first embodiment determining either "1" or "2". FIGS. 7A, 7B, and 7C each illustrate the different probability of the auxiliary comparator 130 determining either '1' or '0'.

In FIGS. 7A through 7C, the reference voltage of the comparator 120 is Vr5 as an example. Further, since the offset of the auxiliary comparator 130 with respect to the comparator 120 is −0.5 LSB, and the voltage of the offset itself has no error due to being controlled with −0.5 LSB.

FIG. 7A illustrates the reference voltage of the auxiliary comparator 130 when the output of the DAC 110 has no error. When the output of the DAC 110 has no error, the voltage difference between the reference voltages Vr4 and Vr5 is 1 LSB (i.e., Vr/8).

In such a case, when the auxiliary comparator 130 performs the determination of the value of the digital signal 16 times, the number of times the digital signal of the auxiliary comparator 130 is switched to '1' is eight, and the number of times the digital signal of the auxiliary comparator 130 is switched to '0' is eight.

That is, the probability of the digital signal output by the comparator 130 being switched to '1' and the probability of the digital signal output by the comparator 130 being switched to '0' are 50% and 50%, respectively.

Further, the error (Error) between the reference voltages Vr4 and Vr5 is Error=8/8−1=0 (LSB).

In addition, as illustrated in FIG. 7B, when the voltage difference between the reference voltages Vr4 and Vr5 is 0.5 LSB, the reference voltage of the comparator 120 is Vr5, and the reference voltage of the auxiliary comparator 130 is Vr4.

In such a case, when the auxiliary comparator 130 performs the determination of the value of the digital signal 16 times, the number of times the digital signal of the auxiliary comparator 130 is switched to '1' is 16, and the number of times the digital signal of the auxiliary comparator 130 is switched to '0' is zero.

That is, the probability of the digital signal output by the comparator 130 being switched to '1' and the probability of the digital signal output by the comparator 130 being switched to '0' are 100% and 0%, respectively.

Further, the error (Error) between the reference voltages Vr4 and Vr5 is Error=8/16−1=0 (LSB).

In addition, as illustrated in FIG. 7C, when the voltage difference between the reference voltages Vr4 and Vr5 is 0.5 LSB, the reference voltage of the comparator 120 is Vr5, and the reference voltage of the auxiliary comparator 130 is Vr5−0.5 LSB.

In such a case, when the auxiliary comparator 130 performs the determination of the value of the digital signal 16 times, the number of times the digital signal of the auxiliary comparator 130 is switched to '1' is four, and the number of times the digital signal of the auxiliary comparator 130 is switched to '0' is 12.

That is, the probability of the digital signal output by the comparator 130 being switched to '1' and the probability of the digital signal output by the comparator 130 being switched to '0' are 25% and 75%, respectively.

Further, the error (Error) between the reference voltages Vr4 and Vr5 is Error=8/4−=1 (LSB).

Next, operations of the comparator 120, which includes the auxiliary comparator 140 in addition to the auxiliary comparator 130, are illustrated with reference to FIG. 8.

FIG. 8 is a diagram illustrating operating examples of the comparator 120, and auxiliary comparators 130 and 140 in the AD converter 100 according to the first embodiment.

(A) of FIG. 8 is a diagram illustrating specific examples of characteristics of the digital signals DU3, DU2, DU1 and DU0 output by the comparator 120. The characteristics illustrated in (A) of FIG. 8 are identical to the characteristics illustrated in (A) of FIG. 6.

In (B) of FIG. 8, the comparator 120, and the auxiliary comparators 130 and 140 are schematically illustrated in order to illustrate the reference voltages of the comparator 120 and the auxiliary comparators 130 and 140 when the digital signals DU2 and DU0 are acquired.

For example, it is assumed that the digital signals DU3, DU2, DU1 and DU0 output by the comparator 120 are DU3='0', DU2='1', DU1='0' and DU0='0', respectively, as illustrated in (A) of FIG. 8.

Similar to the digital signals DU2 and DU0, when the value of the digital signal DU(N) is changed from '1' to '0', the input voltage Vin resides between the reference voltage Vr4 of the comparator 120 when the digital signal DU2 is acquired and the reference voltage Vr5 of the comparator 120 when the digital signal DU0 is acquired.

Note that a case similar to the above is observed in the digital signals DU2 and DU1 (='0') illustrated in (A) of FIG. 8. However, since the reference voltage of the comparator 120 is closer to the input voltage Vin when the digital signal DU0 is acquired than when the digital signal DU1 is acquired. Hence, a case in which the digital signals DU2 and DU0 are acquired is illustrated below.

Note that when the digital signal DU2 of the comparator 120 is switched to '1', the digital signal of the auxiliary comparator 130 is switched to '1'. This is because the auxiliary comparator 130 has an offset of −0.5 LSB with respect to the comparator 120. In this case, when the reference voltage of the comparator 120 is Vr4 that is lower than the input voltage Vin of the DAC 110, the reference voltage of the auxiliary comparator 130 is also lower than the input voltage Vin.

Further, in this case, the digital signal of the auxiliary comparator 140 is switched to '1' or '0'. This is because the auxiliary comparator 140 has an offset of +0.5 LSB with respect to the comparator 120. In this case, when the reference voltage of the comparator 120 is Vr4 that is lower than the input voltage Vin of the DAC 110, the reference voltage of the auxiliary comparator 140 may be either higher or lower than the input voltage Vin.

On the other hand, when the digital signal DU0 of the comparator 120 is switched to '0', the digital signal of the auxiliary comparator 130 is switched to '1' or '0'. This is because the auxiliary comparator 130 has an offset of −0.5 LSB with respect to the comparator 120. In this case, when the reference voltage of the comparator 120 is Vr5 that is higher than the input voltage Vin of the DAC 110, the reference voltage of the auxiliary comparator 130 may be either higher or lower than the input voltage Vin.

Further, in this case, the digital signal of the auxiliary comparator 140 is switched to '0'. This is because the auxiliary comparator 140 has an offset of +0.5 LSB with respect to the comparator 120. In this case, when the reference voltage of the comparator 120 is Vr5 that is higher than the input voltage Vin of the DAC 110, the reference voltage of the auxiliary comparator 140 is also higher than the input voltage Vin.

In such a case, when the voltage difference between the reference voltages Vr4 and Vr5 is 1 LSB and includes no error, the digital signal of the auxiliary comparator 140 for the comparator 120 outputting the digital signal DU2 is equal to the digital signal of the auxiliary comparator 130 for the comparator 120 outputting the digital signal DU0.

Next, a case where the voltage difference between the reference voltages Vr4 and Vr5 includes an error, and the voltage difference is deviated from 1 LSB in FIG. 8 is illustrated with reference to FIGS. 9A to 9C.

FIGS. 9A through 9C are schematic diagrams illustrating relationships between reference voltages of the comparator 120 and the auxiliary comparators 130 and 140, and digital signals in the AD converter 100 according to the first embodiment. The voltage difference between the reference voltages Vr(n) and Vr(n+1) may vary in FIGS. 9A through 9C. Note that n represents any natural number selected from 0 to 15.

In addition, when the reference voltage of the comparator 120 is Vr(n+1), the residual signal of the DAC 110 is less than 1 LSB, which indicates a phase of determining the least significant bit (LSB) of the digital signal Dout of the AD converter 100 (i.e., the final step).

In the example of FIG. 9A, the reference voltage of the auxiliary comparator 140 when the reference voltage of the comparator 120 is Vr(n) is equal to the reference voltage of the auxiliary comparator 130 when the reference voltage of the comparator 120 is Vr(n+1), and the reference voltages of the comparators 130 and 140 are both VrA.

The auxiliary comparator 140 has +0.5 LSB offset with respect to the comparator 120, and the auxiliary comparator 130 has −0.5 LSB offset with respect to the comparator 120. Accordingly, the voltage difference between the reference voltages Vr(n) and Vr(n+1) is 1 LSB in the example illustrated in FIG. 9A.

In this case, the DAC 110 includes no error, and the voltage difference between the reference voltages Vr(n) and Vr(n+1) is 1 LSB.

In such a case, two gradations, which are a gradation from Vr(n) to VrA, and a gradation from VrA to Vr(n+1), may be acquired between the reference voltages Vr(n) and Vr(n+1) based on the reference voltage VrA of the auxiliary comparators 130 and 140.

Note that the two gradations are expressed by two bits. That is, the digital signal of the auxiliary comparator 140 is defined as the second bit, and the digital signal of the auxiliary comparator 130 is defined as the first bit to express the above two gradations by the two bits. In this case, the reference voltage from Vr(n) to VrA is expressed as '00', and the reference voltage from VrA to Vr(n+1) is expressed as '11'.

Thus, in the example illustrated in FIG. 9A, the two gradations formed of the gradation from Vr(n) to VrA and the gradation from VrA to Vr(n+1) may be acquired between the reference voltages Vr(n) and Vr(n+1) based on the reference voltage VrA of the auxiliary comparators 130 and 140.

In addition, as illustrated in FIG. 9B, the reference voltage of the auxiliary comparator 140 when the reference voltage of the comparator 120 is Vr(n) differs from the reference voltage of the auxiliary comparator 130 when the reference voltage of the comparator 120 is Vr(n+1), and the reference voltages of the comparators 130 and 140 are as follows.

In the example of FIG. 9B, a reference voltage VrB1 of the auxiliary comparator 140 when the reference voltage of the comparator 120 is Vr(n) is higher than a reference voltage VrB2 of the auxiliary comparator 130 when the reference voltage of the comparator 120 is Vr(n+1).

The above state may be observed when the voltage difference between the reference voltages Vr(n) and Vr(n+1) is less than 1 LSB due to an error of the DAC 110.

In this case, three gradations, which are a gradation from Vr(n) to VrB2, a gradation from VrB2 to VrB1, and a gradation from VrB1 to Vr(n+1), may be acquired between the reference voltages Vr(n) and Vr(n+1).

Hence, three gradations acquired between the reference voltages Vr(n) and Vr(n+1) may be expressed as follows. For example, the reference voltage from Vr(n) to VrB2 is expressed as '00', the reference voltage from VrB2 to VrB1 is expressed as '01', and the reference voltage from VrB1 to Vr(n+1) is expressed as '11'.

In the example of FIG. 9C, a reference voltage VrC1 of the auxiliary comparator 140 when the reference voltage of the comparator 120 is Vr(n) is lower than a reference voltage VrC2 of the auxiliary comparator 130 when the reference voltage of the comparator 120 is Vr(n+1).

The above state may be observed when the voltage difference between the reference voltages Vr(n) and Vr(n+1) is greater than 1 LSB due to an error of the DAC 110.

In this case, three gradations, which are a gradation from Vr(n) to VrC1, a gradation from VrC1 to VrC2, and a gradation from VrC2 to Vr(n+1), may be acquired between the reference voltages Vr(n) and Vr(n+1).

Hence, three gradations acquired between the reference voltages Vr(n) and Vr(n+1) may be expressed as follows. For example, the reference voltage from Vr(n) to VrC1 is expressed as '00', the reference voltage from VrC1 to VrC2 is expressed as '10', and the reference voltage from VrC2 to Vr(n+1) is expressed as '11'.

As described above, the number of gradations of the AD converter 100 may be increased by at least two gradations greater than the number of gradations of the DAC 110 utilizing the auxiliary comparators 130 and 140. Specifically, when the DAC 110 includes an error (corresponding to 1 LSB), the number of gradations may be increased by three gradations utilizing the auxiliary comparators 130 and 140.

In this example, the 4-bit AD converter 100 is described. However, when the auxiliary comparators 130 and 140 are added to a 10-bit AD converter, and the DAC includes no error, the AD converter may serve as an 11-bit AD converter increased by one bit. That is, 2048 gradations may be obtained in the 10-bit AD converter having the auxiliary comparators 130 and 140.

Further, when the DAC 110 includes an error, a gradation corresponding to '01' (see FIG. 9B) or a gradation corresponding to '10' (see FIG. 9C) may be added. Accordingly, a maximum of 3070 gradations may be obtained.

Further, since the AD conversion is repeatedly executed in a chronological order, +3 dB may be acquired due to the AD conversion at different times and an averaging effect of the errors of the DAC 110. Accordingly, the gradations corresponding to 11.5 bits may be obtained.

Hence, when the offsets of the auxiliary comparators 130 and 140 with respect to the comparator 120 are set to ±0.5 LSB, the gradations of the AD converter 100 may be increased.

Note that the offsets of the auxiliary comparators 130 and 140 that are set to ±0.5 LSB are illustrated in this embodiment. However, the offsets of the auxiliary comparators 130 and 140 may not be limited to ±0.5 LSB. The offsets of the auxiliary comparators 130 and 140 may be any values insofar as the values are less than 1 LSB of the DAC 110.

Next, an offset adjustment method of the auxiliary comparators 130 and 140 is illustrated.

FIG. 10 is a diagram illustrating an offset adjusting method of the comparator 130 in the AD converter 100 according to the first embodiment.

For example, the digital signal of the auxiliary comparator 130 is switched to '1' when the reference voltage of the comparator 120 is Vr(n), and the digital signal of the auxiliary comparator 130 is switched to '0' when the reference voltage of the comparator 120 is Vr(n+1).

When the reference voltage of the comparator 120 is Vr(n+1), the residual signal of the DAC 110 is less than 1 LSB, which indicates a phase of determining the least significant bit (LSB) of the digital signal Dout of the AD converter 100 (i.e., the final step).

In this case, when the reference voltage of the comparator 120 is Vr(n+1), the digital signal of the auxiliary comparator 130 resides between the reference voltages Vr(n) and Vr(n+1).

That is, when a value of the digital signal Dout obtained by the AD converter 100 is an even number, the reference voltage of the auxiliary comparator 130 resides between the reference voltages Vr(n) and Vr(n+1). When the reference voltage of the auxiliary comparator 130 resides between the reference voltages Vr(n) and Vr(n+1), the value of the digital signal of the auxiliary comparator 130 may be '0' or '1'.

Similarly, the digital signal of the auxiliary comparator 140 is '0' when the reference voltage of the comparator 120 is Vr(n), and the digital signal of the auxiliary comparator 140 is 1' when the reference voltage of the comparator 120 is Vr(n+1).

In this case, when the reference voltage of the comparator 120 is Vr(n+1), the digital signal of the auxiliary comparator 140 resides between the reference voltages Vr(n) and Vr(n+1).

That is, when a value of the digital signal Dout obtained by the AD converter 100 is an odd number, the reference voltage of the auxiliary comparator 140 resides between the reference voltages Vr(n) and Vr(n+1). When the reference voltage of the auxiliary comparator 140 resides between the reference voltages Vr(n) and Vr(n+1), the value of the digital signal of the auxiliary comparator 140 may be '0' or '1'.

Hence, the ratio of the digital signal of the auxiliary comparator 130 or 140 switched to '0' and '1' may differ according to the error contained in the voltage difference between the reference voltages Vr(n) and Vr(n+1) of the DAC 110.

Such an error of the DAC 110 may differ according to respective n values of Vr(n) and Vr(n+1) (n is any natural number selected from 0 to 15). The above error of the DAC 110 may be generated due to variability in the capacitances of the 32 capacitors contained in the DAC 110.

Accordingly, when the AD conversion is performed by the AD converter 100 utilizing the DAC 110 including the error, the digital signal Dout output by the SAR controller 150 may include an error.

Accordingly, the AD converter 100 according to the first embodiment corrects the digital signal Dout output by the SAR controller 150. The digital signal Dout is corrected by utilizing the auxiliary comparators 130 and 140 having ±0.5 LSB offsets with respect to the comparator 120.

In order to set the offset of the auxiliary comparator 130 with respect to the comparator 120 to +0.5 LSB, a testing input signal Vin is input to the AD converter 100, and the number of digital signals of the auxiliary comparator 130 input from a control logic 150A of the SAR controller 150 is counted by a counter of the threshold controller 160. That is, the threshold of the auxiliary comparator 130 is set in advance such that the ratio of '0' and '1' contained in the digital signal of the auxiliary comparator 130 is 50:50.

When the digital signal Dout is an even number, the reference voltage of the auxiliary comparator 130 resides between the reference voltages Vr(n) and Vr(n+1). Further, the error of the DAC 110 differs according to respective n values of Vr(n) and Vr(n+1). That is, the error of the DAC 110 may differ according to the voltage difference between the reference voltages Vr4 and Vr5, and the distribution (i.e., the variability) of errors of the capacitors of the DAC 110.

That is, the threshold of the auxiliary comparator 130 is set in advance such that the ratio of '0' and '1' contained in the digital signal of the auxiliary comparator 130 is 50:50. In the above-described method, the offset of the auxiliary comparator 130 with respect to the comparator 120 is set approximately to +0.5 LSB.

The threshold of the auxiliary comparator 130 may be set by inputting the testing input signal Vin in advance to drive the AD converter 100 before implementing the AD converter 100 in an electronic apparatus such as the mobile phone terminal 500 (see FIGS. 1A and 1B).

Note that, the threshold of the auxiliary comparator 130 may change according to an environmental temperature or deterioration with aging. Thus, even after having the AD converter 100 implemented into the electronic apparatus, the threshold of the auxiliary comparator 130 may be adjusted by utilizing the digital signal obtained by the auxiliary comparator 130 along with the driving of the AD converter 100.

Similarly, in order to set the offset of the auxiliary comparator 140 with respect to the comparator 120 to +0.5 LSB, an input signal Vin may be input as testing data into the AD converter 100, and the number of digital signals of the auxiliary comparator 140 input from the control logic 150A of the SAR controller 150 is counted by the counter of the threshold controller 160. Thereafter, the threshold of the auxiliary comparator 140 is set in advance such that the ratio of '0' and '1' contained in the digital signal of the auxiliary comparator 140 is 50:50.

The threshold of the auxiliary comparator 140 may be set by acquiring numerous digital signals of the auxiliary comparator 130 in a case where the value of the digital signal Dout is an odd number, in a manner similar to the method of setting the threshold of the auxiliary comparator 130. Further, even after having the AD converter 100 implemented into the electronic apparatus, the threshold of the auxiliary comparator 140 may be adjusted by utilizing the digital signal obtained by the auxiliary comparator 140 along with the driving of the AD converter 100.

In addition, although the offsets of the auxiliary comparators 130 and 140 are configured to be set with respect to the comparator 120 in this embodiment, the offsets of the auxiliary comparators 130 and 140 may be set as fixed values.

Further, the digital signal Dout may be corrected utilizing the ratio of the '0' and '1' contained in the digital signal of the auxiliary comparator 140. The correction of the digital signal Dout is described later with reference to FIG. 12.

In the following, circuits of the auxiliary comparators 130 and 140 in the AD converter 100 according to the first embodiment are described with reference to FIG. 11.

Figure 11:
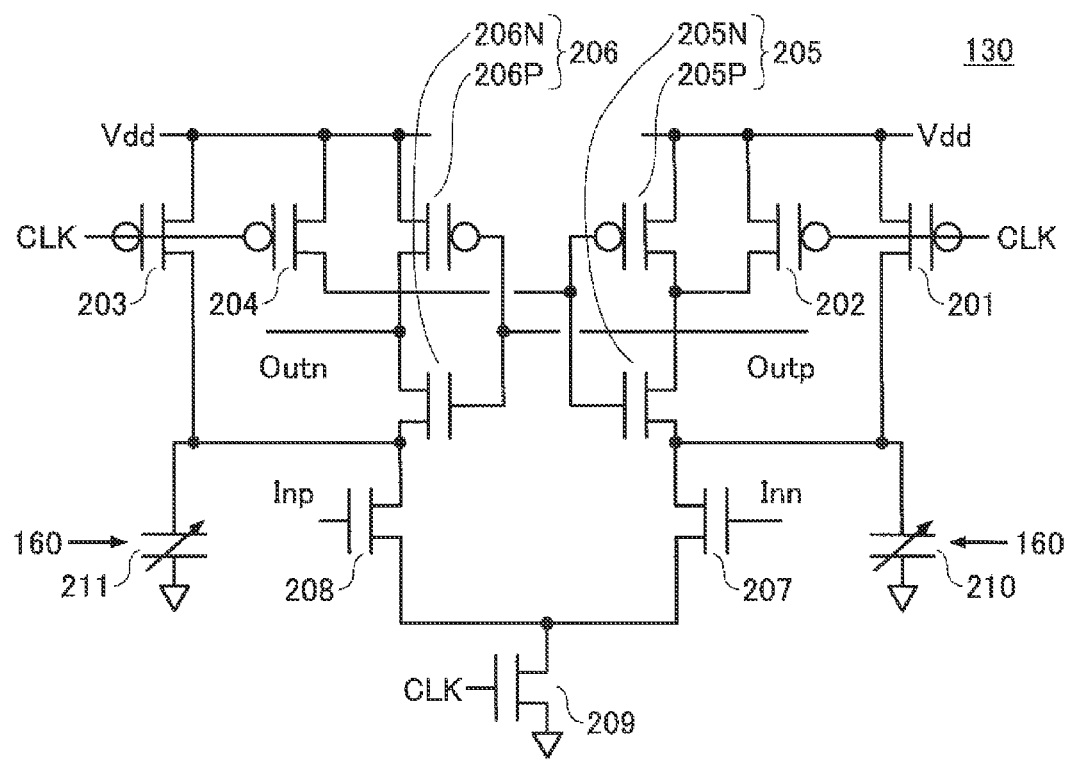
FIG. 11 is a diagram illustrating a circuit of the auxiliary comparator 130 in the AD converter 100 according to the first embodiment.

FIG. 11 is a diagram illustrating the circuit of the comparator 130 in the AD converter 100 according to the first embodiment. Since the auxiliary comparators 130 and 140 have similar circuit configurations, the circuit configuration of the auxiliary comparator 130 is described as a representative.

The auxiliary comparator 130 is a comparator capable of adjusting the threshold voltage. The auxiliary comparator 130 includes PMOS (P-type metal oxide semiconductor) transistors 201, 202, 203, and 204, and inverters 205 and 206, NMOS (N-type metal oxide semiconductor) transistors 207, 208, and 209, and variable capacitors 210 and 211.

The auxiliary comparator 130 illustrated in FIG. 11 includes input terminals Inp and Inn, and output terminals Outp and Outn. The input terminal Inp is connected to the input terminal of the AD converter 100, so that the input voltage Vin is input to the input terminal Inp. The input terminal Inn is connected to the output terminal of the DAC 110, so that the reference voltage is input to the input terminal Inn. The output terminal Outp is connected to the SAR controller 150, so that a digital signal indicating a determination result of the auxiliary comparator 130 is input to the SAR controller 150. Note that the output terminal Outn is a dummy so that there is no specific connecting destination to the output terminal Outn.

A clock CLK is input to gates of the PMOS transistors 201 and 202, and sources of the PMOS transistors 201 and 202 are connected to a power supply Vdd. A drain of the PMOS transistor 201 is connected to a source of the variable capacitor 210, a source of an NMOS transistor 205N of the inverter 205 and a drain of an NMOS transistor 207. A drain of the PMOS transistor 202 is connected to a drain of a PMOS transistor 205P of the inverter 205, the source of the NMOS transistor 205N, a drain of a PMOS transistor 206P, and the output terminal Outp.

A clock CLK is input to gates of the PMOS transistors 203 and 204, and sources of the PMOS transistors 203 and 204 are connected to a power supply Vdd. A drain of the PMOS transistor 203 is connected to a source of the variable capacitor 211, a source of an NMOS transistor 206N of an inverter 206, and a drain of an NMOS transistor 208. A drain of the PMOS transistor 204 is connected to a drain of a PMOS transistor 206P of the inverter 206, the source of the NMOS transistor 206N, the drain of the PMOS transistor 205P, the source of the NMOS transistor 205N, and the output terminal Outp.

The inverter 205 includes the PMOS transistor 205P and the NMOS transistor 205N. A source of the PMOS transistor 205P is connected to a power supply Vdd, a gate of the PMOS transistor 205P is connected to a gate of the transistor 205N, and a drain of the PMOS transistor 205P is connected to a drain of the NMOS transistor 205N. The drain of the PMOS transistor 205P and the drain of the NMOS transistor 205N are connected to the output terminal Outp. The source of the NMOS transistor 205N is connected to the variable capacitor 210 and the drain of the NMOS transistor 207.

The inverter 206 includes the PMOS transistor 206P and the NMOS transistor 205N. A source of the PMOS transistor 206P is connected to a power supply Vdd, a gate of the PMOS transistor 206P is connected to a gate of the transistor 206N, and a drain of the NMOS transistor 206P is connected to a drain of the NMOS transistor 206N. The drain of the PMOS transistor 206P and the drain of the NMOS transistor 206N are connected to the output terminal Outp. The source of the NMOS transistor 205N is connected to the variable capacitor 211 and the drain of the NMOS transistor 206.

The drain of the NMOS transistor 207 is connected to the source of the NMOS transistor 205N and the capacitor 210, the gate of the NMOS transistor 207 is connected to the input terminal Inn, and the source of the NMOS transistor 207 is connected to a drain of an NMOS transistor 209.

The drain of the NMOS transistor 208 is connected to the source of the NMOS transistor 206N and the capacitor 211, the gate of the NMOS transistor 208 is connected to the input terminal Inp, and the source of the NMOS transistor 208 is connected to the drain of the NMOS transistor 209.

The drain of the NMOS transistor 209 is connected to the source of the NMOS transistor 207 and the source of the NMOS transistor 208, a clock CLK is input to the gate of the NMOS transistor 209, and a source of the NMOS transistor 209 is grounded.

One of the terminals of the variable capacitor 210 is connected to the drain of the PMOS transistor 201, the source of the NMOS transistor 205N, and the drain of the NMOS transistor 207, and the other terminal of the variable capacitor 210 is grounded. The variable capacitance of the variable capacitor 210 is controlled based on a threshold control signal input from the threshold controller 160.

One of the terminals of the variable capacitor 211 is connected to the drain of the PMOS transistor 203, the source of the NMOS transistor 206N, and the drain of the NMOS transistor 208, and the other terminal of the variable capacitor 211 is grounded. The variable capacitance of the variable capacitor 211 is controlled based on a threshold control signal input from the threshold controller 160.

To reset the auxiliary comparator 130, the clock CLK is switched to a low (L) level to turn on the pull-up PMOS transistors 201, 202, 203, and 204. As a result, the output voltage values of the output terminals Outp and Outn are Vdd, and the voltages of nodes to which upper electrodes of the capacitors 210 and 211 are connected are Vdd.

When the clock CLK is switched to a high (H) level, the NMOS transistor 209 is turned on. At this moment, the NMOS transistor 207 is turned on in response to a voltage input to the input terminals Inp and Inn. Accordingly, the voltage (Vdd) of the nodes connected to the upper electrodes of the variable capacitors 210 and 211 allows a current to flow in drain-source intervals of the NMOS transistors 207 and 208.

Since this current is proportional to the voltage values input to the input terminals Inp and Inn, the current may cause a voltage drop in the output terminals Outp and Outn. The voltage difference between the output terminals Outp and Outn is amplified by the positive feedback inverters 205 and 206. Hence, the digital signal (i.e., a value '0' or '1') representing a compared result, which is obtained by comparing the input voltage Vin input to the input terminal Inp and a comparison voltage input to the input terminal Inn, is output to the SAR controller 150.

The value of the digital signal output from the output terminal Outp may be affected by an internal electrostatic capacitance of the auxiliary comparator 130.

Accordingly, the threshold of the auxiliary comparator 130 may be set within the capacitances of the variable capacitors 210 and 211 based on the threshold control signal input from the threshold controller 160.

FIG. 12 is a diagram illustrating the digital signal Dout corrected by the AD converter 100 according to the first embodiment. FIG. 12 illustrates various data in a tabular form. The data illustrated in FIG. 12 are created by Microsoft Excel (registered trademark). FIG. 12 illustrates row numbers 1 to 24 and column numbers B to O.

The first row illustrates digital signals DU3, DU2, DU1, and DU0 of four bits contained in the digital signal Dout.

The second row illustrates weights of the respective bits of the DAC 110 as "Ideal". The third row illustrates errors of capacitances of the respective bits of the DAC 110 as "Error". The errors of the capacitances are set values as examples. The fourth row illustrates actual weights of the respective bits of the DAC 110, which are obtained by adding the weights (Ideal) of the respective bits and the errors of the capacitances of the respective bits. Each of the actual weights of the respective bits (i.e., the weight (Actual) including a corresponding error) is a sum of the weight (Ideal) of a corresponding bit illustrated in the second row and the error (Error) of the capacitance of the corresponding bit illustrated in the third row.

The fifth row illustrates errors (Calculated) of the respective bits, which are computed based on a DNL (differential non linearity error) of the errors detected by the auxiliary comparator 130 or 140. Note that a method of calculating the errors (Calculated) of the respective bits illustrated in columns C, D, E, and F in the fifth row will be described later.

The Dout values 15 to 0 are illustrated from $9^{th}$ to $24^{th}$ rows in the column B. Further, the values (i.e., '0' or '1') of the digital signals DU3, DU2, DU1, and DU0 are illustrated from $9^{th}$ to $27^{th}$ rows in columns C, D, E, E, and F.

As the actual errors (Actual Error), the actual values (i.e., values (Actual) shifted by the errors) of the Dout values 15 to 0, and their DNL and INL (integral non linearity error) are illustrated from $9^{th}$ to $24^{th}$ rows in columns G, H, and I.

Each of the actual values (Actual) of the respective Dout values 15 to 0 is a sum of products of the values of the respective bits of the digital signals DU3, DU2, DU1, and DU0 and the actual weights (Actual) of the respective bits illustrated in the fourth row. That is, the actual values (Actual) of the Dout 15 to 0 illustrated in column G indicate actual values of the Dout 15 to 0 that are shifted by the respective errors of the DAC 110.

Note that the INL in column I indicate the shifts (the differences) between the actual values (Actual) of the Dout 15 to 0 illustrated in column G and the ideal straight line of the digital signals Dout 0 to 15 with respect to the input voltage Vi. Further, the DNL in column H indicate values obtained by subtracting the INL of a previous code from the INL of the identical code. For example, the value (0.16) in the $22^{nd}$ row of column H is obtained by subtracting the INL in the $23^{rd}$ row of column I from the INL in $22^{nd}$ row of column I.

The $9^{th}$ to $24^{th}$ rows in columns J, K and L illustrate counted values (Counts), and their DNL and INL as detected errors (Detected Error).

The counted values (Counts) in column J represent the number of times the auxiliary comparator 130 or 140 outputs '0' when the AD converter 100 has conducted the AD conversion 16 times.

When the comparator 120 outputs '0', the auxiliary comparator 130 outputs '0' or '1' and the auxiliary comparator 140 outputs '0'. In addition, when the comparator 120 outputs '1', the auxiliary comparator 130 outputs '0' and the auxiliary comparator 140 outputs '0' or '1'.

Hence, the when the digital signal DU0 is switched to '0' and the digital signal Dout is an even number, the auxiliary comparator 130 represents the number of even numbers counted in column J. On the other hand, the when the digital signal DU0 is switched to '1' and the digital signal Dout is an odd number, the auxiliary comparator 140 represents the number of odd numbers counted in column J.

The counted values (Counts) indicated in column J are represented by counted values (Counts)=8/(1+DNL) when using the DNL in the identical row of column H. That is, the counted values (Counts) in column J represent the number of even numbers counted by the auxiliary comparator 130 or 140 in a case where the Dout values 0 to 15 are deviated from the ideal straight line due to the respective errors of the DAC 110.

The DNL in column K is represented by DNL=8/{counted value in the identical row (Counts)−1}.

The INL in column L is represented by/{INL in a previous row (a row below)+DNL in the identical row}.

The $9^{th}$ to $24^{th}$ rows in columns M, N and O illustrate Dout_c, INL_c, and DNL_c as corrected values (After Correction).

The Dout_c in column M indicates a corrected digital signal obtained by correcting the digital signal Dout utilizing the errors (Calculated) of the respective bits illustrated in the $5^{th}$ row. Further, the INL_c in column N and the DNL_c in column O indicate corrected INL and DNL obtained by correcting the DNL in column H and the INL in column I utilizing the errors (Calculated) of the respective bits illustrated in the $5^{th}$ row.

Note that the error correction of the digital signal Dout may be achieved by the method of least squares performed with respect to the detected errors illustrated, for example, in columns J, K, and L.

However, the error correction by the method of least squares may require computing the mean of the sum of the squares of the respective counted values (Counts) of the Dout 0 to 15. Such computation of the mean of the sum of the squares of the respective errors may also be required for DNL and INL illustrated in columns K and L.

That is, the error correction by the method of least squares may require an enormous amount of computation.

Hence, in the first embodiment, the digital signal Dout is corrected as follows.

Initially, a part where the digital signal DU0 is changed from '0' to '1' is focused on, for example. An example of such a part is observed when '0' in the $16^{th}$ row is changed to '1' in the $15^{th}$ row of column F.

The change from '0' in the 16$^{th}$ row to '1' in the 15$^{th}$ row of column F includes an error generated when the digital signal DU0 is changed from '0' to '1' among the errors of the DAC 110.

Accordingly, the error of the digital signal DU0 indicated in the 15$^{th}$ row of column F is a DNL (i.e., DNL in the 15$^{th}$ row of column K) of the error detected by the auxiliary comparator 130 or 140 when the digital signal DU0 '0' in the 16$^{th}$ row is changed to '1' in the 15$^{th}$ row of column F. Thus, the error of the digital signal DU0 illustrated in the 5$^{th}$ row of column F is −0.16.

Further, among the errors of the DAC 110, the error generated when the digital signal DU1 is changed from '0' to '1' is an error retained until the digital signal DU1 is changed into '1' in the 14$^{th}$ row of column E after the digital signal DU0 is changed from '0' in the 16$^{th}$ row to '1' in the 15$^{th}$ row of column F.

Accordingly, the error of the digital signal DU1 indicated in the 5$^{th}$ row of column E is a value obtained by adding the DNL (i.e., DNL (0.16) in the 14$^{th}$ row of column K) of the error detected by the auxiliary comparator 130 or 140 to the error (−0.16) of the digital signal DU0 in the 5$^{th}$ row of column F. Thus, the error of the digital signal DU1 illustrated in the 5$^{th}$ row of column E is 0.

Further, among the errors of the DAC 110, the error generated when the digital signal DU2 is changed from '0' to '1' is an error retained until the digital signal DU2 is changed into '1' in the 12$^{th}$ row of column D after the digital signal DU1 is changed to '1' in the 14$^{th}$ row of column E.

Accordingly, the error of the digital signal DU2 indicated in the 5$^{th}$ row of column D is a value obtained by adding the error (−0.16) of the digital signal DU0 in the 5$^{th}$ row of column F, the error (0) of the digital signal DU1 indicated in the 5$^{th}$ row of column E, the DNL (i.e., DNL (−0.16) in the 13$^{th}$ row of column K) of the error detected by the auxiliary comparator 130 or 140, and the DNL (−0.10) in the 12$^{th}$ row of column K. Thus, the error of the digital signal DU2 illustrated in the 5$^{th}$ row of column D is −0.27. Note that, the value rounded to one decimal place may vary since a round-off process affects the value rounded to one decimal place.

Further, among the errors of the DAC 110, the error generated when the digital signal DU3 is changed from '0' to '1' is an error retained until the digital signal DU3 is changed from '0' in the 17$^{th}$ row of column C to '1' in the 16$^{th}$ row of column C.

Accordingly, the error of the digital signal DU3 indicated in the 5$^{th}$ row of column C is a value obtained by adding the error (−0.16) of the digital signal DU0 in the 5$^{th}$ row of column F, the error (0) of the digital signal DU1 indicated in the 5$^{th}$ row of column E, the error (0.27) of the digital signal DU2 indicated in the 5$^{th}$ row of column D, and the DNL (i.e., DNL (0.87) in the 16$^{th}$ row of column K) of the error detected by the auxiliary comparator 130 or 140. Thus, the error of the digital signal DU3 illustrated in the 5$^{th}$ row of column C is −0.43.

In the first embodiment, the DNL of the error detected by the auxiliary comparator 130 or 140 is obtained as illustrated above, and the digital signal Dout is corrected by the output correction part 170 (see FIG. 2) utilizing the DNL.

The DNL of the error detected by the auxiliary comparator 130 or 140 is a value determined based on the ratio of '0' and '1' contained in the digital signal of the auxiliary comparator 130 or 140. Hence, correcting the digital signal Dout utilizing the DNL of the error detected by the auxiliary comparator 130 or 140 indicates correcting a value of the digital signal Dout based on the ratio of '0' and '1' contained in the digital signal of the auxiliary comparator 130 or 140.

The digital signal Dout_c illustrated in column M is the sum of values obtained by adding the weights of the respective bits in the second row of columns C, D, E, and F to the errors (Calculated) of the respective bits in the fifth row of columns C, D, E, and F, and then multiplying the resultant values of the respective bits by values of the DU3, DU2, DU1, and DU0 contained in the digital signal Dout, respectively.

Note that the weights of the respective bits in the second row of columns C, D, E, and F may be represented by any one of 8, 4, 2, and 1. The values of the DU3, DU2, DU1, and DU0 contained in the digital signal Dout may be represented by any one of '0' and '1'.

Hence, the digital signal Dout_c(0.84) indicated in the 23$^{rd}$ of column M is specifically obtained by Dout_c=DU3('0')× (8+0.43)+DU2('0')×(4+(−0.27))+DU1('0')×(2+0.00)+DU0 ('1')×(1+(−0.16)).

Likewise, the digital signal Dout_c (8.43) indicated in the 16$^{th}$ of column M is specifically obtained by Dout_c=DU3 ('1')×(8+0.43)+DU2 ('0')×(4+(−0.27))+DU1('0')×(2+ 0.00)+DU0('0')×(1+(−0.16)).

Likewise, the digital signal Dout_c(14.16) indicated in the 10$^{th}$ of column M is specifically obtained by Dout_c=DU3 ('1')×(8+0.43)+DU2 ('1')×(4+(−0.27))+DU1('1')×(2+ 0.00)+DU0('0')×(1+(−0.16)).

As illustrated above, the digital signal Dout is corrected to the digital signal Dout_c. The above-described correcting process is performed by the output correction part 170.

The aforementioned correction of the digital signal Dout utilizing the errors (Calculated) of the respective bits may significantly reduce the amount of computation compared to the correcting method requiring the enormous amount of computation such as the method of least squares.

Further, the DNL and INL of the actual values (Actual) of the Dout values 15 to 0 indicated in columns H and I may be corrected as those indicated in columns N and O by subtracting the DNL and INL of the detected errors (Detected Error) indicated in columns K and L. The corrected values (After correction INL_c, DNL_c) are all 0.0.

Figure 13A:
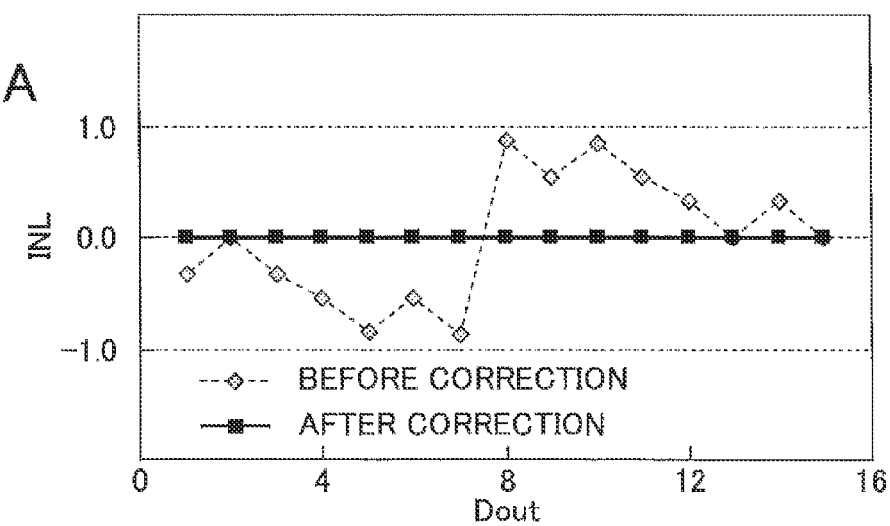
FIGS. 13A through 13C are diagrams illustrating characteristics of INL_c, DNL_c, and Dout_c corrected by the AD converter 100 according to the first embodiment.
Figure 13B:
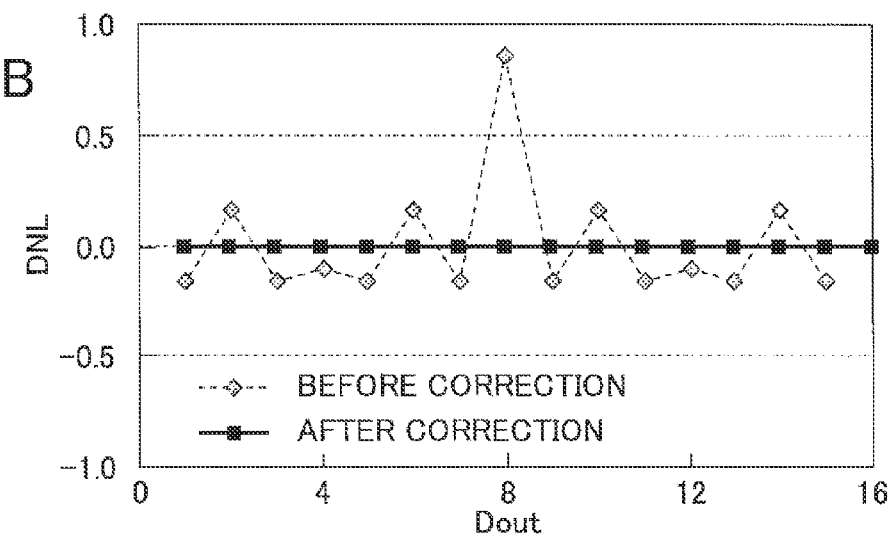
Figure 13C:
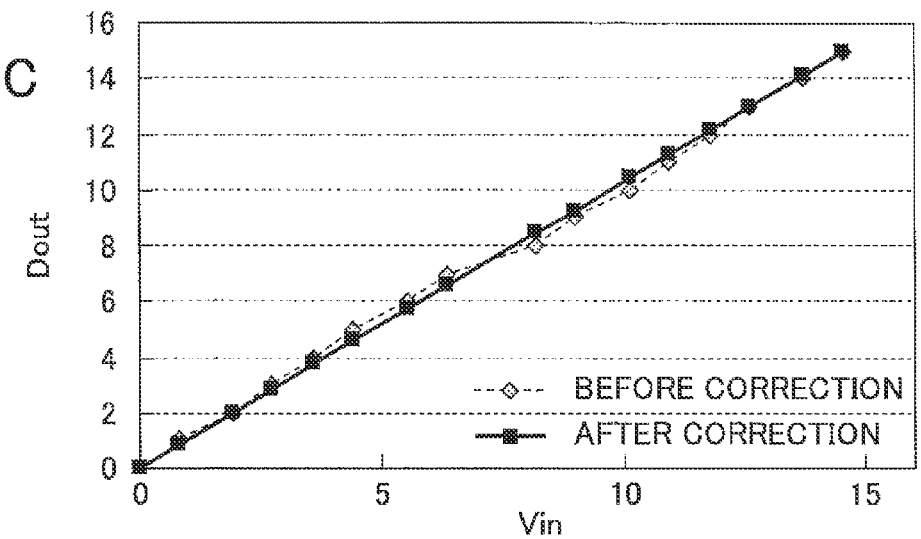

FIGS. 13A through 13C are diagrams illustrating characteristics of INL_c, DNL_c, and Dout_c corrected by the AD converter 100 according to the first embodiment. FIG. 13A illustrates the characteristics of INL_c, FIG. 13B illustrates the characteristics of DNL_c, and FIG. 13C illustrates the characteristics of Dout_c.

The corrected INL_c is indicated by a solid line and the actual errors (Actual Error) INL before the correction is indicated by a broken line in FIG. 13A. Note that the corrected INL_c corresponds to the values indicated in column N of FIG. 12, and the actual errors INL (Actual Error) before the correction correspond to the values indicated in column I of FIG. 12.

As illustrated in FIG. 13A, the actual errors (Actual Error) INL before the correction includes random errors; however, the INL values of the corrected INL_c are 0.0, indicating the constant INL values.

The corrected DNL_c is indicated by a solid line and the actual errors (Actual Error) DNL before the correction are indicated by a broken line in FIG. 13B. Note that the corrected DNL_c corresponds to the values indicated in column O of FIG. 12, and the actual errors (Actual Error) DNL before the correction correspond to the values indicated in column H of FIG. 12.

As illustrated in FIG. 13B, the actual errors (Actual Error) DNL before the correction includes random errors; however, the DNL values of the corrected DNL_c are 0.0, indicating the constant DNL values.

The corrected digital signal Dout_c is indicated by a solid line and the actual errors (Actual Error) of the digital signal Dout before the correction are indicated by a broken line in FIG. 13C. Note that the corrected digital signal Dout_c corresponds to the values indicated in column M of FIG. 12, and the actual errors (Actual Error) of the digital signal Dout before the correction correspond to the values indicated in column G of FIG. 12. The horizontal axis illustrates the input voltage Vin.

As illustrated in FIG. 13C, a broken line illustrating the actual errors (Actual Error) of the digital signal Dout before the correction is bent. This is due to the effect of the errors of the DAC 110.

By contrast, the corrected digital signal Dout_c depicts a straight line exhibiting a constant positive slope with respect to an increase of the input voltage Vin.

This is because the corrected digital signal Dout_c indicated by the solid line in FIG. 13C is generated by correcting the digital signal Dout before the correction indicated by the broken line in FIG. 13C in a vertical axis direction utilizing the errors of the respective bits (see the $5^{th}$ row of FIG. 12) computed based on the DNL of the error detected by the auxiliary comparator 130 or 140.

That is, the AD converter 100 according to the first embodiment does not correct the error of the DAC 110 in an input voltage Vin direction illustrated in FIG. 13C but corrects the digital signal Dout in the vertical axis direction, thereby correcting the linearity of the digital signal Dout.

As described above, the AD converter 100 according to the first embodiment may be able to correct the digital signal Dout including the error of the DAC 110 utilizing the DNL of the error detected by the auxiliary comparator 130 or 140.

Further, the AD converter 100 according to the first embodiment may be able to detect an error less than 1 LSB of the DAC 110 and perform the detection of an error in a background process while simultaneously causing the comparator 120 to perform the AD conversion by utilizing the auxiliary comparators 130 and 140 connected in parallel with the comparator 120.

Accordingly, highly accurate conversion may be performed without increasing the number of bits (or gradations) of the DAC 110 while improving the conversion rate of the AD converter 100.

The related art analog-to-digital (AD) converter exhibits the reduced conversion rate because the AD converter performs the correction of the conversion in addition to acquiring the first conversion result. Further, the related art AD conversion method may exhibit the reduced conversion rate due to the fact that the AD converter performs the AD conversion while giving the known analog voltages $+\Delta V$ and $-\Delta V$ for shifting a determining point.

By contrast, the AD converter 100 according to the first embodiment may be able to detect the error simultaneously with causing the comparator 120 to perform the AD conversion by utilizing the auxiliary comparators 130 and 140 having ±0.5 LSB offset with respect to the comparator 120. Accordingly, the conversion rate of the AD converter 100 may be improved.

The above-described embodiment illustrates an example of the AD converter 100 having the two auxiliary comparators 130 and 140. However, the AD converter 100 may include three or more auxiliary comparators.

Figure 14:
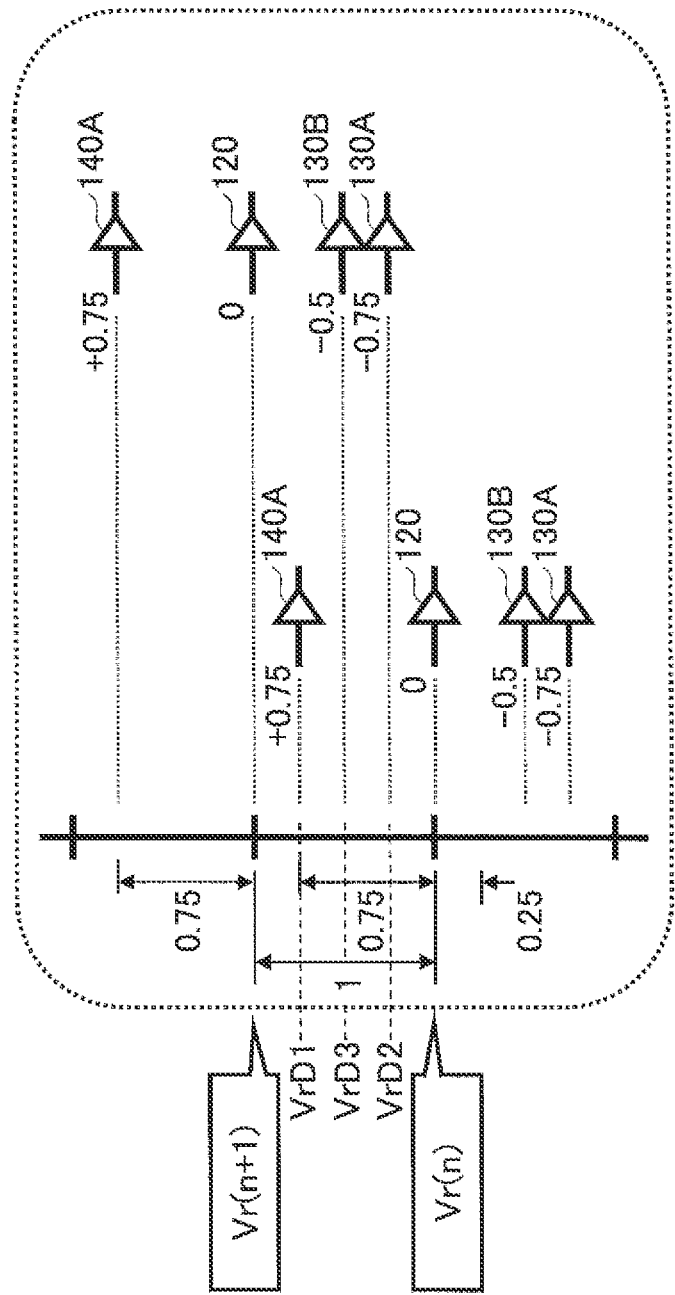
FIG. 14 is a diagram illustrating offsets of auxiliary comparators in a modification of the AD converter 100 according to the first embodiment.

FIG. 14 is a diagram illustrating offsets of auxiliary comparators in a modification of the AD converter 100 according to the first embodiment.

FIG. 14 illustrates three auxiliary comparators 130A, 130B, and 140A having offsets less than 1 LSB with respect to the comparator 120. The auxiliary comparator 130A is an example of a first sub-comparator, the auxiliary comparator 140A is an example of a second sub-comparator, and the auxiliary comparator 130B is an example of a third sub-comparator.

The auxiliary comparator 130A illustrated in FIG. 14 has −0.75 LSB offset with respect to the comparator 120. Further, the auxiliary comparator 130B has −0.5 LSB offset with respect to the comparator 120. In addition, the auxiliary comparator 140A has +0.75 LSB offset with respect to the comparator 120.

The offset may be set in the auxiliary comparator 130B in a manner similar to the offset setting of the auxiliary comparator 130 as illustrated with reference to FIG. 10.

Further, the threshold of the auxiliary comparator 130A may be set such that the ratio of '0' and '1' contained in the digital signal of the auxiliary comparator 130A results in 25:75, for example, by inputting the testing input signal Vin into the AD converter and causing the counter of the threshold controller 160 to count the digital signals of the auxiliary comparator 130A.

Hence, the offset of the auxiliary comparator 130A with respect to the comparator 120 may be set to −0.75 LSB in a manner illustrated above.

Similarly, the threshold of the auxiliary comparator 140A may be set such that the ratio of '0' and '1' contained in the digital signal of the auxiliary comparator 140A results in 75:25, for example, by causing the counter of the threshold controller 160 to count the digital signals of the auxiliary comparator 140A.

Hence, the offset of the auxiliary comparator 140A with respect to the comparator 120 may be set to +0.75 LSB in a manner illustrated above.

Hence, in a case where the AD converter 100 according to the first embodiment includes three auxiliary comparators 130A, 130B and 140A, the reference voltage of the comparator 120 may be Vr(n) in a step before the final step. Consequently, the reference voltage of the comparator 120 may be Vr(n+1) in the final step. Note that, the difference between the reference voltages Vr(n) and Vr(n+1) is 1 LSB.

The reference voltage VrD1 of the auxiliary comparator 140A when the reference voltage of the comparator 120 is Vr(n) is higher than reference voltages VrD2 and VrD3 of the auxiliary comparators 130A and 130B when the reference voltage of the comparator 120 is Vr(n+1).

In this case, four gradations, which are a gradation from Vr(n) to VrD2, a gradation from VrD2 to VrD3, a gradation from VrD3 to VrD1, and a gradation from VrD1 to Vr(n+1) may be acquired between the reference voltages Vr(n) and Vr(n+1).

As illustrated in FIG. 14, the modification of the AD converter may be capable of increasing the three gradations within 1 LSB between the Vr(n) and Vr(n+1) so as to detect an error more precisely by employing the three auxiliary comparators 130A, 130B, and 140A in comparison to the AD converter 100 illustrated in FIG. 3.

Note that in FIG. 14 the auxiliary comparator 130A is illustrated as an example of a first sub-comparator, the auxiliary comparator 140A is illustrated as an example of a second sub-comparator, and the auxiliary comparator 130B is illustrated as an example of a third sub-comparator. However, the modification of the AD converter according to the first embodiment may further include a fourth sub-comparator having a positive offset less than 1 LSB with respect to the comparator 120 and differing from the offset of the auxiliary comparator 140A serving as an example of the second sub-comparator in place of the auxiliary comparator 130B serving as the third sub-comparator.

Figure 15:
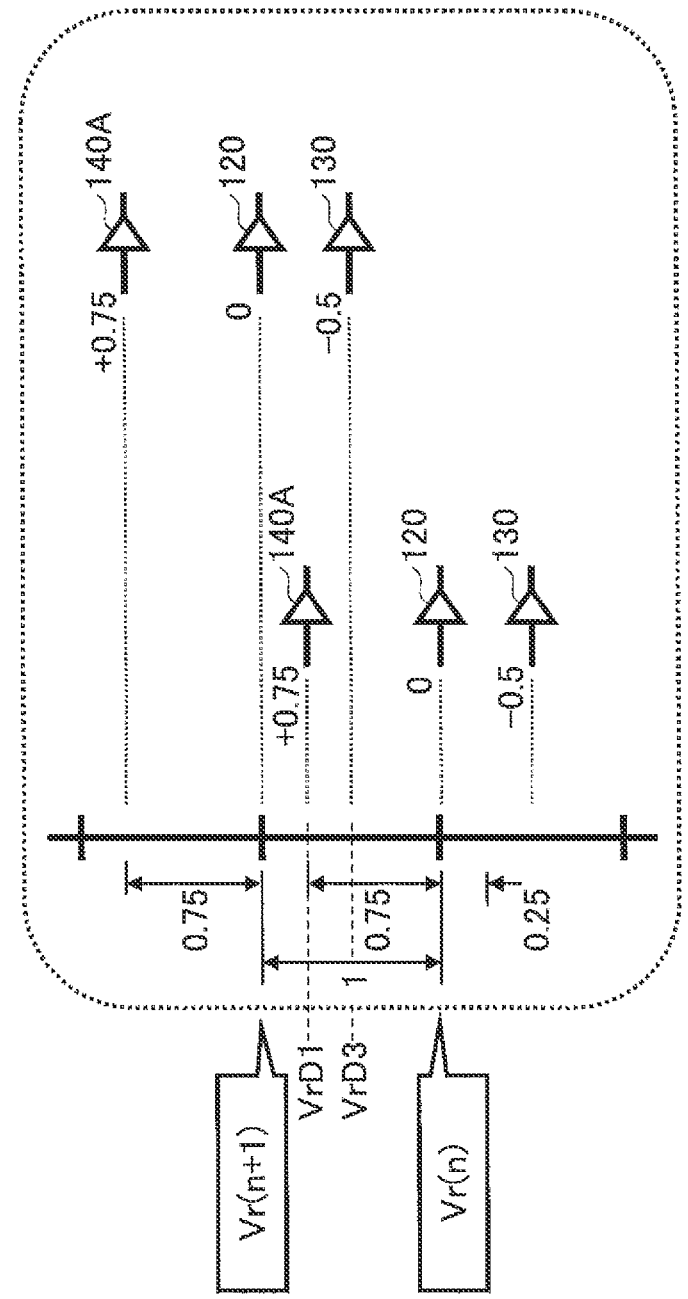
FIG. 15 is a diagram illustrating offsets of auxiliary comparators in another modification of the AD converter 100 according to the first embodiment.

FIG. 15 is a diagram illustrating offsets of auxiliary comparators in another modification of the AD converter 100 according to the first embodiment.

As illustrated in FIG. 15, absolute values of the offsets of two auxiliary comparators 130 and 140A mutually differ with respect to the comparator 120.

The auxiliary comparator 130 illustrated in FIG. 15 is similar to the auxiliary comparator 130 illustrated in FIG. 3, and hence, the auxiliary comparator 130 illustrated in FIG. 15 has −0.5 LSB offset with respect to the comparator 120.

Further, the auxiliary comparator 140A illustrated in FIG. 15 is similar to the auxiliary comparator 140A illustrated in FIG. 14, and hence, the auxiliary comparator 140A illustrated in FIG. 15 has +0.75 LSB offset with respect to the comparator 120.

Hence, in a case where another modification of the AD converter 100 according to the first embodiment includes the two auxiliary comparators 130 and 140A, the reference voltage of the comparator 120 may be Vr(n) in a step before the final step. Consequently, the reference voltage of the comparator 120 may be Vr(n+1) in the final step. Note that, the difference between the reference voltages Vr(n) and Vr(n+1) is 1 LSB.

The reference voltage VrD1 of the auxiliary comparator 140A when the reference voltage of the comparator 120 is Vr(n) is higher than reference voltages VrD3 of the auxiliary comparators 13 when the reference voltage of the comparator 120 is Vr(n+1).

In this case, three gradations, which are a gradation from Vr(n) to VrD3, a gradation from VrD3 to VrD1, and a gradation from VrD1 to Vr(n+1), may be acquired between the reference voltages Vr(n) and Vr(n+1).

As illustrated in FIG. 14, the modification of the AD converter may be capable of increasing the two gradations within 1 LSB between the Vr(n) and Vr(n+1) so as to detect an error more precisely by employing the two auxiliary comparators 130 and 140A having the absolute values of the offsets differing from each other in comparison to the AD converter 100 illustrated in FIG. 3.

Thus, the AD converter 100 according to the first embodiment may be capable of determining the gradations less than 1 LSB of the DAC 110 without increasing the number of bits of the DAC 100 by employing the auxiliary comparators 130 and 140 in addition to the comparator 120.

Further, since the AD converter 100 according to the first embodiment is capable of causing the comparator 120 to perform the AD conversion simultaneously with causing the auxiliary comparators 130 and 140 to perform the AD conversion, the conversion rate may be improved.

Second Embodiment

Figure 16:
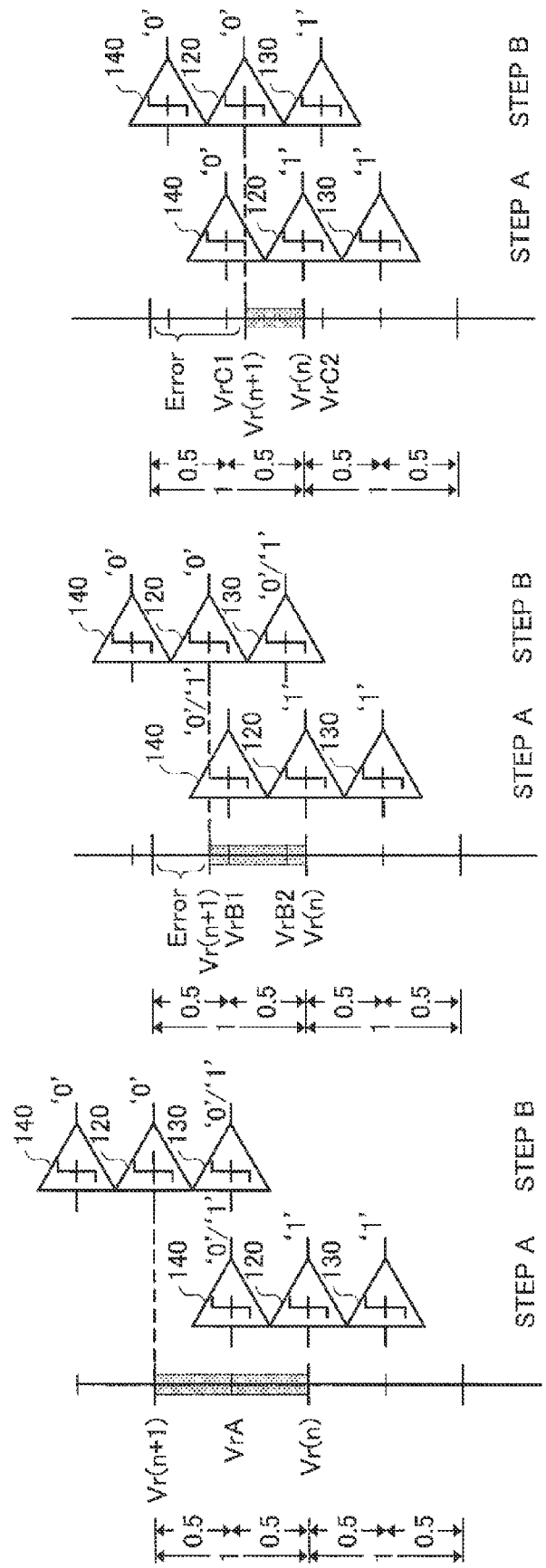
FIGS. 16A through 16C are schematic diagrams illustrating relationships between reference voltages of a comparator 120, and auxiliary comparators 130 and 140, and digital signals in an AD converter according to a second embodiment.

FIGS. 16A to 16C are schematic diagrams illustrating a relationship between reference voltages of the comparator 120 and the auxiliary comparators 130 and 140, and digital signals in an analog-to-digital (AD) converter according to a second embodiment. The voltage difference between the reference voltages Vr(n) and Vr(n+1) may vary in FIGS. 16A through 16C. Note that n represents any natural number selected from 0 to 15. In FIGS. 16A through 16C, a unit of a numerical value indication on the vertical axis is LSB.

In addition, when the reference voltage of the comparator 120 is Vr(n+1), the residual signal of the DAC 110 is less than 1 LSB, which indicates a phase of determining the least significant bit (LSB) of the digital signal Dout of the AD converter 100 (i.e., the final step).

In the example of FIG. 16A, the reference voltage of the auxiliary comparator 140, when the reference voltage of the comparator 120 is Vr(n), is equal to the reference voltage of the auxiliary comparator 130 when the reference voltage of the comparator 120 is Vr(n+1), and the reference voltages of the comparators 130 and 140 are both VrA.

The auxiliary comparator 140 has +0.5 LSB offset with respect to the comparator 120, and the auxiliary comparator 130 has −0.5 LSB offset with respect to the comparator 120. Accordingly, the voltage difference between the reference voltages Vr(n) and Vr(n+1) is 1 LSB in the example illustrated in FIG. 16A.

In addition, the digital signal of the auxiliary comparator 130 is switched to '1' when the reference voltage of the comparator 120 is Vr(n), and the digital signal of the auxiliary comparator 130 is switched to '0' when the reference voltage of the comparator 120 is Vr(n+1). Hence, the input voltage Vin resides between the reference voltages Vr(n) and Vr(n+1). Thus, the vertical axis between the reference voltages Vr(n) and Vr(n+1) is indicated by a gray color.

In this state, the reference voltage VrA of the auxiliary comparator 130 when the reference voltage of the comparator 120 is Vr(n+1) in the final step resides between the reference voltages Vr(n) and Vr(n+1). Thus, the probability P0 in which the digital signal output of the comparator 130 is switched to '0' and the probability P1 in which the digital signal output of the comparator 130 is '01 are both 50% in the final step.

In addition, in the example of FIG. 16B, a reference voltage VrB1 of the auxiliary comparator 140 when the reference voltage of the comparator 120 is Vr(n) is higher than a reference voltage VrB2 of the auxiliary comparator 130 when the reference voltage of the comparator 120 is Vr(n+1).

The above state may be observed when the voltage difference between the reference voltages Vr(n) and Vr(n+1) is less than 1 LSB, generating an error of the DAC 110.

In addition, the digital signal of the auxiliary comparator 130 is switched to '1' when the reference voltage of the comparator 120 is Vr(n), and the digital signal of the auxiliary comparator 130 is switched to '0' when the reference voltage of the comparator 120 is Vr(n+1). Hence, the input voltage Vin resides between the reference voltages Vr(n) and Vr(n+1).

Thus, the vertical axis between the reference voltages Vr(n) and Vr(n+1) is indicated by a gray color.

In this case, the reference voltage VrB2 of the auxiliary comparator 130 when the reference voltage of the comparator 120 is Vr(n+1) in the final step resides between the reference voltages Vr(n) and Vr(n+1).

Thus, the probability P0 in which the digital signal output of the comparator 130 is switched to '0' is 20% and the probability P1 in which the digital signal output of the comparator 130 is '1' is 80% in the final step.

In this case, an error (Error) (for 1 LSB) between the reference voltages Vr(n) and Vr(n+1) is calculated by (P0/P1−1)×0.5 LSB), and hence, the error (Error) results in −0.375 LSB.

In the example of FIG. 16C, a reference voltage VrC1 of the auxiliary comparator 140, when the reference voltage of the comparator 120 is Vr(n), is higher than a reference voltage VrC2 of the auxiliary comparator 130 when the reference voltage of the comparator 120 is Vr(n+1). FIG. 16C illustrates an example in which an absolute value of an error (Error) (for 1 LSB) between the reference voltages Vr(n) and Vr(n+1) is greater than that of −0.5 LSB. Specifically, FIG. 16C illustrates a case in which the error (Error)<−0.5 LSB.

In addition, the digital signal of the auxiliary comparator 130 is switched to '1' when the reference voltage of the comparator 120 is Vr(n), and the digital signal of the auxiliary comparator 130 is switched to '0' when the reference voltage of the comparator 120 is Vr(n+1). Hence, the input voltage Vin resides between the reference voltages Vr(n) and Vr(n+1). Thus, the vertical axis between the reference voltages Vr(n) and Vr(n+1) is indicated by a gray color.

In this case, the reference voltage VrC2 of the auxiliary comparator 130 when the reference voltage of the comparator 120 is Vr(n+1) in the final step does not reside between the reference voltages Vr(n) and Vr(n+1), but is less than Vr(n).

Consequently, the output of the auxiliary comparator 130 is fixed to '1' in the final step, and the number of errors (Error) may not be detected. That is, in a case where the error (Error)<−0.5 LSB, the number of errors (Error) may not be detected.

In the example of FIG. 16C, the digital signal of the comparator 120 is switched to '1' and the digital signal of the auxiliary comparator 140 is switched to '0' when the reference voltage of the comparator 120 is Vr(n). Thus, the input voltage Vin resides between the reference voltage Vr(n) of the comparator 120 and the reference voltage (Vr(n)+0.5 LSB) of the auxiliary comparator 140 when the reference voltage of the comparator 120 is Vr(n).

Accordingly, when the AD converter according to the second embodiment is in the state illustrated in FIG. 16C, the AD converter may detect an error (Error) in the following manner.

FIGS. 17A and 17B are schematic diagrams illustrating a relationship between the reference voltages of the comparator 120, and the auxiliary comparators 130 and 140, and the digital signals in the AD converter according to the second embodiment.

FIG. 17A illustrates an example as a step A in which a reference voltage VrC1 of the auxiliary comparator 140 when the reference voltage of the comparator 120 is Vr(n) is higher than a reference voltage VrC2 of the auxiliary comparator 130 when the reference voltage of the comparator 120 is Vr(n+1), and the error (Error)<−0.5 LSB, in a manner similar to the example illustrated in FIG. 16C.

In the example of FIG. 17A, the digital signal of the comparator 120 is switched to '1' and the digital signal of the auxiliary comparator 140 is switched to '0' when the reference voltage of the comparator 120 is Vr(n). Thus, the input voltage Vin resides between the reference voltage Vr(n) of the comparator 120 and the reference voltage (Vr(n)+0.5 LSB) of the auxiliary comparator 140 when the reference voltage of the comparator 120 is Vr(n). Accordingly, the vertical axis between the reference voltages Vr(n) and Vr(n)+0.5 LSB is indicated by a gray color.

In FIG. 17A, in a step B serving as the final step, the reference voltage Vr(n+1) of the comparator 120 falls within the range indicated by a gray color on the vertical axis.

In the example of FIG. 17A, the digital signal (DU1) of the comparator 120 is switched to '1' and the digital signal of the auxiliary comparator 140 is switched to '0' when the reference voltage of the comparator 120 is Vr(n).

In this case, the output (i.e., the digital signal DU0) of the comparator 120 is switched to '0' or '1' in the final step. Accordingly, an error (Error) may be detected based on the probability P0a in which the digital signal DU0 is switched to '0' and the probability P1a in which the digital signal DU0 is switched to '1'.

For example, when P0a is 75% and P1a is 25%, the error (Error) is obtained as follows. (P0a/P1a−1)×0.5 LSB=−0.62 LSB. With this method, the error (Error) may be detected when the error (Error) satisfies the following condition: −0.5 LSB<the error (Error)≤−1 LSB.

Note that the step A may be a step before the final step B, or two or more steps before the final step B. In a case where the step A is two or more steps before the step B serving as the final step, the SAR controller 150 may perform control to proceed with the step B when the digital signal of the comparator 120 is switched to '1' and the auxiliary comparator 140 is switched to '0' as illustrated in FIG. 17A.

Note that the order of the step A and step B may be reversed. That is, in a state where the step A is determined as the final step, the step B may be a step before the final step A, or two or more steps before the final step A. In this case, the digital signal of the comparator 120 in the step B is '0', and the digital signal of the comparator 120 in the step A is '0' or '1'.

Further, FIG. 17B illustrates an example in which an absolute value of the error (Error) is further increased. Specifically, FIG. 17B illustrates a case in which the error (Error)<−1 LSB.

In the step A illustrated in FIG. 17B, the digital signal of the comparator 120 is switched to '1' and the digital signal of the auxiliary comparator 140 is switched to '0' when the reference voltage of the comparator 120 is Vr(n). Thus, the input voltage Vin resides between the reference voltage Vr(n) of the comparator 120 and the reference voltage (Vr(n)+0.5 LSB) of the auxiliary comparator 140 when the reference voltage of the comparator 120 is Vr(n). Accordingly, the vertical axis between the reference voltages Vr(n) and Vr(n)+0.5 LSB is indicated by a gray color.

In the step B serving as the final step, the reference voltage (Vr(n+1)+0.5 LSB) of the auxiliary comparator 140 falls within the range indicated by a gray color on the vertical axis.

In such a case, the digital signal of the comparator 120 is fixed to '1'; however, the output (i.e., the digital signal DU0) of the auxiliary comparator 140 is switched to '1' or '0' in the step B serving as the final step. Accordingly, the error (Error) may be detected based on the probability P0b of the digital signal output by the comparator 140 being switched to '0' and the probability P1b of the digital signal output by the comparator 140 switched being to '1'.

For example, when P0b is 25% and P1b is 75%, the error (Error) is obtained as follows. (P0b/P1b−1)×0.5 LSB=−1.375 LSB. With this method, the error (Error) may be detected when the error (Error) satisfies the following condition: −1 LSB<the error (Error)≤−1.5 LSB.

Figure 18:
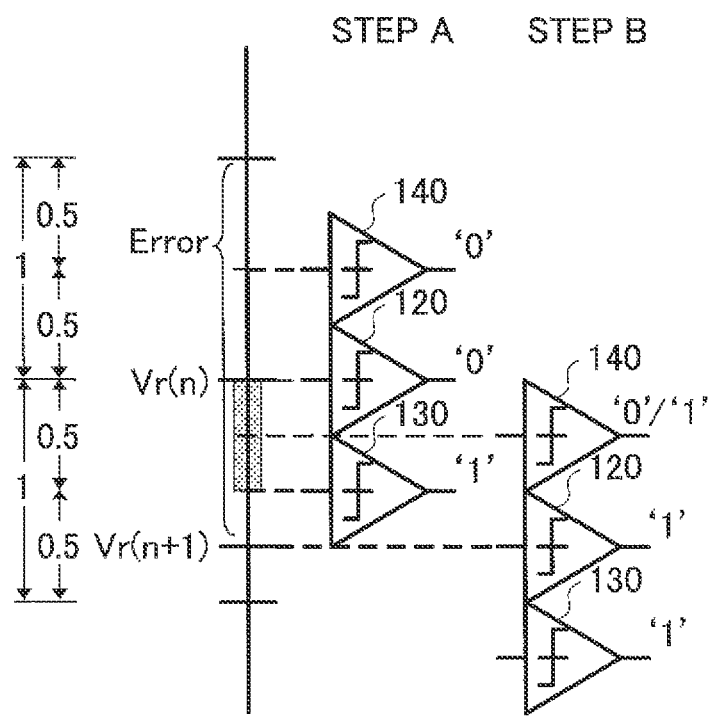
FIG. 18 is a schematic diagram illustrating a relationship between reference voltages of the comparator 120 and the auxiliary comparators 130 and 140, and digital signals in the AD converter according to the second embodiment.

Further, when the absolute value of the error (Error) is greater than −1.5 LSB; that is, when the error (Error)≤−1.5 LSB, the error (Error) may be detected as illustrated in FIG. 18.

Note that the step A may be a step before the final step B, or two or more steps before the final step B. In a case where the step A is two or more steps before the step B serving as the final step, the SAR controller 150 may perform control to proceed with the step B when the digital signal of the comparator 120 is switched to '1' and the auxiliary comparator 140 is switched to '0' as illustrated in FIG. 17B.

Note that the order of the step A and step B may be reversed. That is, in a state where the step A is determined as the final step, the step B may be a step before the final step A, or two or more steps before the final step A. In this case, the digital signal of the auxiliary comparator 140 in the step B is '0', and the digital signal of the auxiliary comparator 140 in the step A is '0' or '1'.

Figure 17:
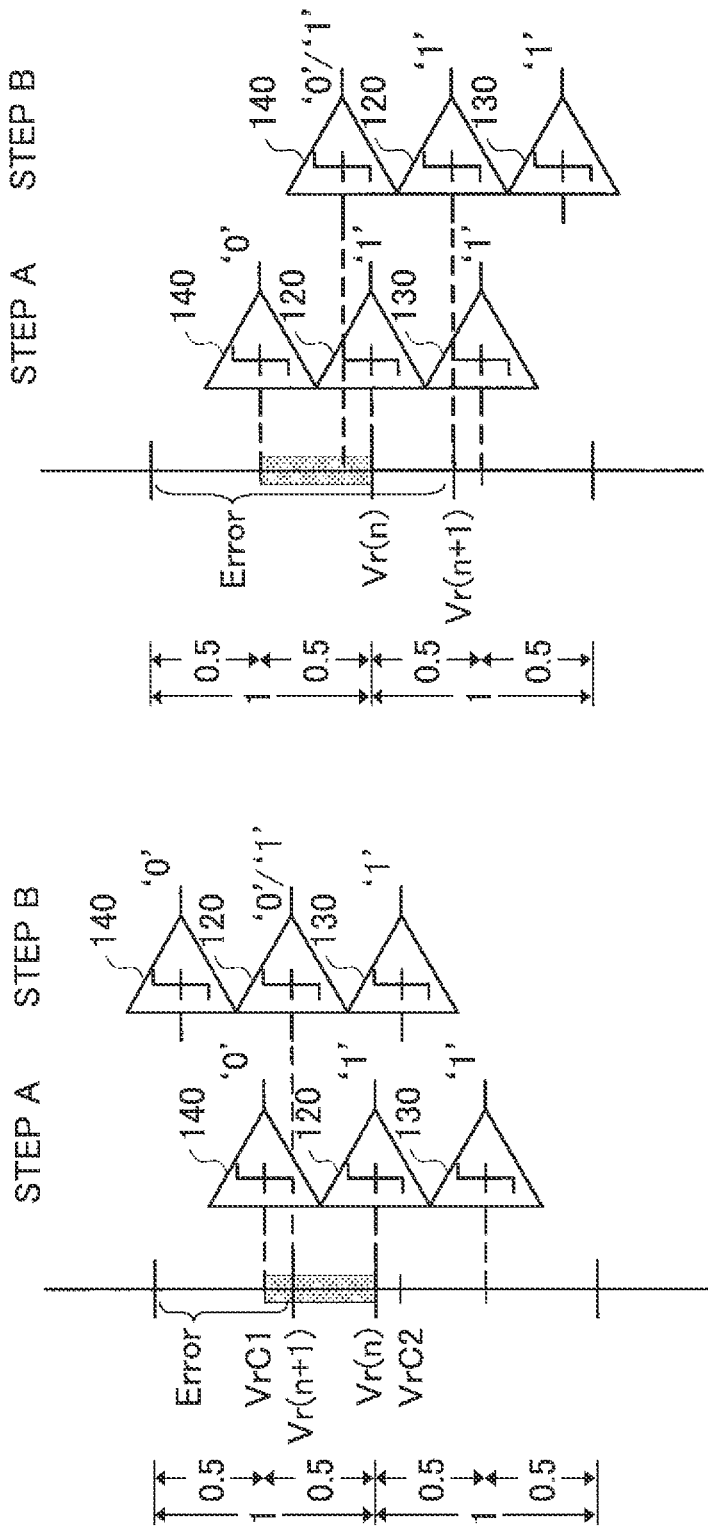
FIGS. 17A and 17B are schematic diagrams illustrating relationships between reference voltages of the comparator 120 and the auxiliary comparators 130 and 140, and digital signals in the AD converter according to the second embodiment.

As illustrated in FIG. 17, when the absolute value of the error contained in the DAC 110 is greater than the absolute value of the offset of the auxiliary comparator 130 or 140 with respect to the comparator 120, the digital signal Dout is corrected by utilizing the errors of the respective bits derived based on the digital signal of the comparator 120.

FIG. 18 is a schematic diagram illustrating a relationship between the reference voltages of the comparator 120, and the auxiliary comparators 130 and 140, and the digital signals in the AD converter according to the second embodiment.

FIG. 18 illustrates a case in which the error (Error)<−1.5 LSB.

In a step A of FIG. 18, the digital signal of the comparator 120 is switched to '0' and the digital signal of the auxiliary comparator 130 is switched to '1' when the reference voltage of the comparator 120 is Vr(n). That is, since the input voltage Vin resides between the reference voltages Vr(n) and Vr(n)−0.5 LSB, the vertical axis between the reference voltages Vr(n) and Vr(n)−0.5 LSB is indicated by a gray color.

Further, when the error (Error)<−1.5 LSB in the example as illustrated in FIG. 18, the digital signal of the comparator 120 and the digital signal of the auxiliary comparator 130 are both '1' in the step B serving as the final step where the reference voltage of the comparator 120 is Vr(n+1).

However, in this case, the digital signal of the auxiliary comparator 140 is switched to '0' or '1'.

Accordingly, the error (Error) may be detected based on the probability P0c in which the digital signal of the auxiliary comparator 140 is switched to '0' and the probability P1c in which the digital signal of the auxiliary comparator 140 is switched to '1' in the step B in a case where the digital signal of the comparator 120 is switched to '0' and the digital signal of the auxiliary comparator 130 is switched to '1' under the condition in which the error (Error)<−1.5 LSB and the reference voltage of the comparator 120 is Vr(n).

For example, when P0c is 50% and P1c is 50%, the error (Error) is obtained as follows. −P1c×0.5 LSB−1.5 LSB=−1.75 LSB. With this method, the error (Error) may be detected when the error (Error) satisfies the following condition: −2.0 LSB≤the error (Error)<−1.5 LSB.

Note that the step A may be a step before the final step B, or two or more steps before the final step B. In a case where the step A is two or more steps before the step B serving as the final step, the SAR controller 150 may perform control to proceed with the step B when the digital signal of the comparator 120 is switched to '0' and the auxiliary comparator 130 is switched to '1' as illustrated in the step A of FIG. 18.

Note that the order of the step A and step B may be reversed. That is, in a state where the step A is determined as the final step, the step B may be a step before the final step A, or two or more steps before the final step A. In this case, the digital signal of the auxiliary comparator 140 in the step B is '0', and the digital signal of the auxiliary comparator 130 in the step A is switched to '0' or '1'.

As illustrated in FIG. 18, when the absolute value of the error contained in the DAC 110 is greater than the absolute value of the offset of the auxiliary comparator 130 or 140 with respect to the comparator 120, and the digital signal of the comparator 120 is a fixed value, the digital signal Dout is corrected by utilizing the errors of the respective bits derived based on one having a non-fixed value selected from the digital signals of the auxiliary comparators 130 and 140.

Further, the above-described embodiment illustrates an example of the AD converter 120 employing the two auxiliary comparators 130 and 140 to detect the error. However, the AD converter 100 employing a single auxiliary comparator by eliminating the other auxiliary comparator may also be able to perform the AD conversion as follows.

Figure 19B:
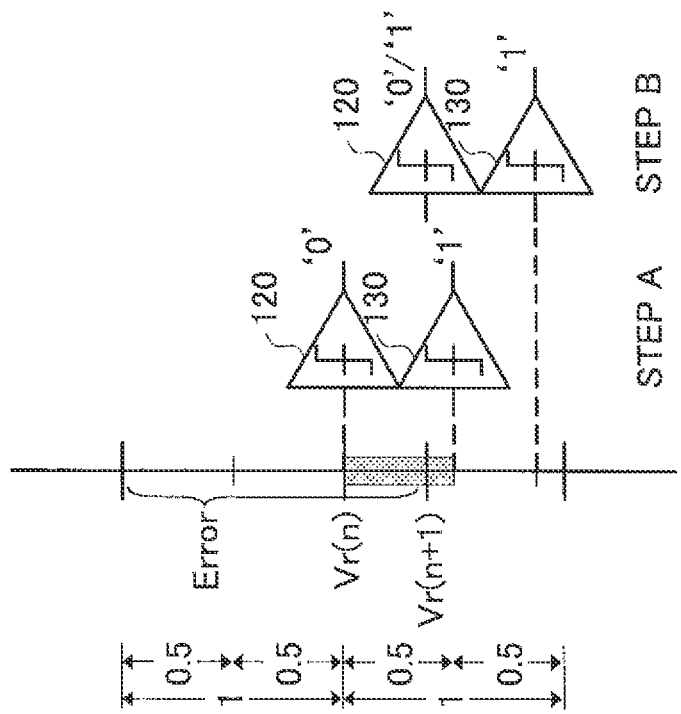
FIGS. 19A and 19B are schematic diagrams illustrating relationships between reference voltages of the comparator 120 and the auxiliary comparator 130, and digital signals in a modification of the AD converter according to the second embodiment.
Figure 19A:
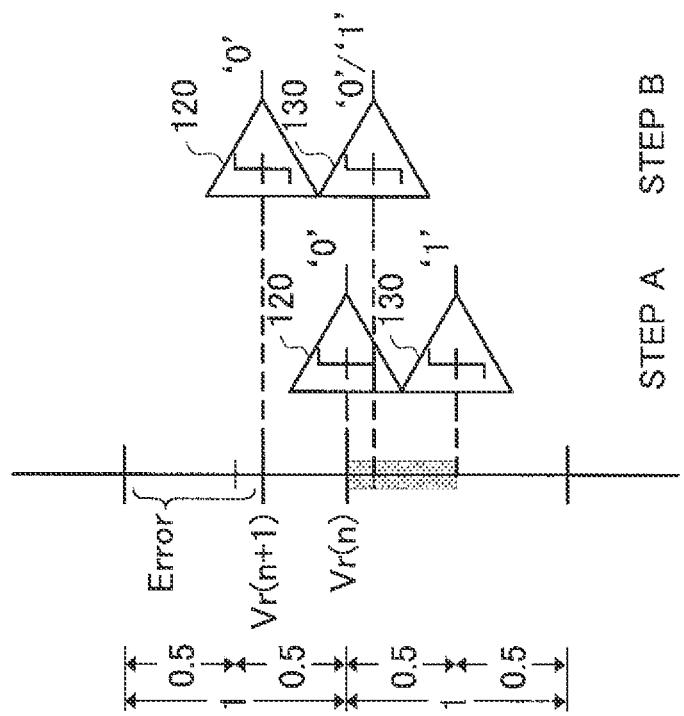

FIGS. 19A and 19B are schematic diagrams illustrating relationships between reference voltages of the comparator 120 and the auxiliary comparator 130, and digital signals in a modification of the AD converter according to the second embodiment.

The modification of the AD converter 120 according to the second embodiment includes the comparator 120 and the auxiliary comparator 130 but does not include the auxiliary comparator 140.

Initially, FIG. 19A illustrates a case in which the error (Error) satisfies the following condition: the error (Error)<−0.5 LSB. Whether the error (Error) satisfies the condition the error (Error)<−0.5 LSB may be determined based on whether the digital signal of the auxiliary comparator 130 is fixed to '1' in the final step, in a manner similar to the case illustrated in FIG. 16C. The state illustrated in FIG. 16C may also be determined by the modification of the AD converter according to the second embodiment that excludes the auxiliary comparator 140.

For example, in a step A of FIG. 19A, the digital signal of the comparator 120 is '0' and the digital signal of the auxiliary comparator 130 is switched to '1' when the reference voltage of the comparator 120 is Vr(n).

In this case, since the input voltage Vin is supposed to reside between the reference voltages Vr(n) and Vr(n)−0.5 LSB, the vertical axis between the reference voltages Vr(n) and Vr(n)−0.5 LSB is indicated by a gray color.

In a case where the step A is a step before the final step, and the digital signal of the comparator 120 is switched to '0' in the step A, the switch φ1 (see FIG. 3) is normally connected to the reference voltage −Vr to determine the level of the input voltage Vin that is lower than the reference voltage Vr(n) in the next step.

However, in the modification of the AD converter according to the second embodiment, the SAR controller 150 connects the switch φ1 to the reference voltage Vr in the above-described case. That is, in the modification of the AD converter according to the second embodiment, the digital output of the comparator 120 in the step A may be treated as '1' so as to connect the switch φ1 to the reference voltage Vr.

As a result, the reference voltage output from the DAC 110 in the step B serving as the final step (i.e., the reference voltage Vr(n+1) input to the comparator 120) is raised higher than the reference voltage Vr(n) of the comparator 120 in the step A, as illustrated in FIG. 19A.

Accordingly, when the reference voltage Vr(n+1) of the comparator 120 is set in the step B, the reference voltage Vr(n+1) deviates from a voltage region indicated by the gray color. As a result, the digital signal of the comparator 120 is switched to '0'.

Further, at this moment, the digital signal of the auxiliary comparator 130 is switched to '1' or '0'. That is, since the error (Error)<−0.5 LSB, the voltage difference between the reference voltages Vr(n) and Vr(n+1) is less than 0.5 LSB.

Accordingly, the error (Error) may be detected based on the probability P0d of the digital signal output by the comparator 130 being switched to '0' and the probability P1d of the digital signal output by the comparator 130 being switched to '1'.

For example, when P0d is 75% and P1d is 25%, the error (Error) is obtained as follows. P0d×0.5 LSB−1 LSB=−0.625 LSB. With this method, the error (Error) may be detected when the error (Error) satisfies the following condition: −1.0 LSB<the error (Error)≤−0.5 LSB.

Note that the step A may be a step before the final step B, or two or more steps before the final step B. In a case where the step A is two or more steps before the step B serving as the final step, the SAR controller 150 may perform control to proceed with the step B when the digital signal of the comparator 120 is switched to '0' and the auxiliary comparator 130 is switched to '1' as illustrated in FIG. 19A.

Further, when the modification of the AD converter according to the second embodiment includes the auxiliary comparator 140 in place of the auxiliary comparator 130, the order of the step A and step B is reversed to make the determination of the value (i.e., '0' or '1') of the digital signal. That is, in a state where the step A is determined as the final step, the step B may be a step before the final step A, or two or more steps before the final step A. In this case, the digital signal of the auxiliary comparator 140 in the step B is '0', and the digital signal of the comparator 120 is '1'. Further, the digital signal of the comparator 120 in the step A is '1', and the digital signal of the auxiliary comparator 140 in the step A is switched to '0' or '1'.

Moreover, FIG. 19B illustrates a case in which the error (Error) satisfies the following condition: −1.5 LSB<the error (Error)<−1 LSB. The method illustrated in FIG. 19B may be performed when the probability P0d of the digital signal of the auxiliary comparator 130 being switched to '0' is zero (P0d=0); that is, when the digital signal of the auxiliary comparator 130 is 'fixed to 1'.

For example, in the step A illustrated in FIG. 19B, the digital signal of the comparator 120 is '0' and the digital signal of the auxiliary comparator 130 is '1' when the reference voltage of the comparator 120 is Vr(n).

In this case, since the input voltage Vin is supposed to reside between the reference voltages Vr(n) and Vr(n)−0.5 LSB, the vertical axis between the reference voltages Vr(n) and Vr(n)−0.5 LSB is indicated by a gray color.

Subsequently, in the step B serving as the final step, the SAR controller 150 normally connects the switch ϕ1 (see FIG. 3) to the reference voltage −Vr. As a result, the reference voltage output from the DAC 110 (i.e., the reference voltage Vr(n+1) input to the comparator 120) is decreased lower than the reference voltage Vr(n).

At this moment, when the error (Error) satisfies the condition: −1.5 LSB<the error (Error), the reference voltage Vr(n+1) falls within a voltage region indicated by the gray color. Hence, the error (Error) may be detected by utilizing the probability P0e of the digital signal of the comparator 120 being switched to '0' and the probability P1e of the digital signal of the comparator 10 being switched to '1'.

For example, when P0e is 20% and P1e is 80%, the error (Error) is obtained as follows. −P1e×0.5 LSB−1 LSB=−1.375 LSB. With this method, the error (Error) may be detected when the error (Error) satisfies the following condition: −1.5 LSB<the error (Error)≤−1.0 LSB. That is, even in a case where the hierarchical relationship between the reference voltages Vr(n) and Vr(n+1) is reversed, the error (Error) may be detected.

Note that the step A may be a step before the final step B, or two or more steps before the final step B. In a case where the step A is two or more steps before the step B serving as the final step, the SAR controller 150 may perform control to proceed with the step B when the digital signal of the comparator 120 is switched to '0' and the auxiliary comparator 130 is switched to '0' as illustrated in FIG. 19B.

Further, when the modification of the AD converter according to the second embodiment includes the auxiliary comparator 140 in place of the auxiliary comparator 130, the order of the step A and step B is reversed to make the determination of the value (i.e., '0' or '1') of the digital signal. That is, in a state where the step A is determined as the final step, the step B may be a step before the final step A, or two or more steps before the final step A. In this case, the digital signal of the auxiliary comparator 140 in the step B is '0' or '1', and the digital signal of the comparator 120 is '1'. Further, the digital signal of the auxiliary comparator 140 in the step A is '0', and the digital signal of the comparator 120 in the step A is switched to '0' or '1'.

In the example illustrated in FIGS. 19A and 19B, when the digital signal of the comparator 120 and the digital signal of the auxiliary comparator 130 mutually differ, the SAR controller 150 may input a binary signal differing from the digital signal of the comparator 120 into the DAC 110. Hence, the output correction part 170 corrects the digital signal Dout by utilizing the digital signal output from the comparator 120 because of the SAR controller 150 inputting the binary signal differing from the digital signal of the comparator 120 into the DAC 110.

So far, the first and the second embodiments of the AD converter and the electronic apparatus are illustrated. However, the invention is not limited to those specifically described embodiments thereof, and various modifications and alteration may be made without departing from the scope of the inventions described in the claims.

The disclosed embodiments and modifications may provide the AD converter having an improved conversion rate, and the electronic apparatus having such an AD converter.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. An analog-to-digital converter comprising:
   a digital-to-analog (DA) converting part having a predetermined number of gradation converting stages and configured to cause each of the predetermined number of gradation converting stages to convert a digital signal to an analog signal and output the converted analog signal;
   a main-comparator configured to output a binary signal on the basis of a first comparison result between the analog signal output from the DA converting part and a predetermined reference level; and
   a sub-comparator having an offset less than a quantization unit with respect to the main-comparator and being configured to output a binary signal on the basis of a second comparison result between the analog signal output from the DA converting part and the predetermined reference level.

2. The analog-to-digital converter as claimed in claim 1, wherein the sub-comparator includes:
   a first sub-comparator having a negative offset less than the quantization unit of the DA converting part with respect to the main-comparator; and
   a second sub-comparator having a positive offset less than the quantization unit of the DA converting part with respect to the main-comparator.

3. The analog-to-digital converter as claimed in claim 2, wherein the positive offset of the second sub-comparator and the negative offset of the first sub-comparator are the same or different from each other in absolute values.

4. The analog-to-digital converter as claimed in claim 2, wherein the sub-comparator further includes a third sub-comparator having a negative offset less than the quantization unit of the DA converting part with respect to the main-comparator and differing from the negative offset of the first sub-comparator.

5. The analog-to-digital converter as claimed in claim 4, wherein the sub-comparator further includes a fourth sub-comparator having a positive offset less than the quantization unit of the DA converting part with respect to the main-comparator and differing from the positive offset of the second sub-comparator.

6. The analog-to-digital converter as claimed in claim 1, further comprising:
an offset controller configured to set the offset based on the second comparison result.

7. The analog-to-digital converter as claimed in claim 6, wherein the offset controller includes a counter configured to count a first signal and a second signal of the binary signal representing the second comparison result of the sub-comparator, and sets the offset such that the first signal and the second signal in the counter represent a predetermined ratio.

8. The analog-to-digital converter as claimed in claim 7, wherein the offset controller causes the counter to count the first signal and the second signal, and sets the offset such that the first signal and the second signal in the counter represent the predetermined ratio.

9. The analog-to-digital converter as claimed in claim 1, further comprising:
a successive approximation controller configured to input the binary signal on the basis of the first comparison result and output a digital signal on the basis of a conversion result of the DA converting part, the digital signal being formed of the binary signal representing the first comparison result.

10. The analog-to-digital converter as claimed in claim 9, wherein the successive approximation controller turns off the sub-comparator until a step preceding a final step in analog-to-digital conversion.

11. The analog-to-digital converter as claimed in claim 9, further comprising:
a correction unit configured to correct the digital signal output from the successive approximation controller based on the binary signal representing the second comparison result output from the sub-comparator.

12. The analog-to-digital converter as claimed in claim 11, wherein the correction unit corrects the digital signal utilizing errors of respective bits derived based on the binary signal representing the second comparison result.

13. An analog-to-digital converter comprising:
a digital-to analog (DA) converting part having a predetermined number of gradation converting stages and configured to cause each of the predetermined number of gradation converting stages to convert a digital signal to an analog signal and output the converted analog signal;
a main-comparator configured to output a binary signal on the basis of a first comparison result between the analog signal output from the DA converting part and a predetermined reference level;
a first sub-comparator having a negative offset less than a quantization unit with respect to the main-comparator and being configured to output a binary signal on the basis of a second comparison result between the analog signal output from the DA converting part and the predetermined reference level;
a second sub-comparator having a positive offset less than the quantization unit with respect to the main-comparator and being configured to output a binary signal representing another second comparison result between the analog signal output from the DA converting part and the predetermined reference level;
a successive approximation controller configured to input the binary signal on the basis of the first comparison result and output a digital signal on the basis of a conversion result of the DA converting part, the digital signal being formed of the binary signal representing the first comparison result; and
a correction unit configured to correct the digital signal output from the successive approximation controller based on the binary signal representing one of the second comparison result output from the first sub-comparator and the other second comparison result output from the second sub-comparator, wherein
the correction unit corrects the digital signal utilizing errors of respective bits derived based on the binary signal representing the first comparison result of the main-comparator, in a case where an absolute value of an error contained in the DA converting part is greater than an absolute value of the offset.

14. The analog-to-digital converter as claimed in claim 13, wherein the correction unit corrects the digital signal utilizing errors of respective bits derived based on a binary signal representing the second comparison result of one of the first sub-comparator and the second sub-comparator, the second comparison result indicating a non-fixed value, in a case where the absolute value of the error contained in the DA converting part is greater than the absolute value of the offset, and the first comparison result of the main comparator is a fixed value.

15. An analog-to-digital converter comprising:
a digital-to analog (DA) converting part having a predetermined number of gradation converting stages and configured to cause each of the predetermined number of gradation converting stages to convert a digital signal to an analog signal and output the converted analog signal;
a main-comparator configured to output a binary signal on the basis of a first comparison result between the analog signal output from the DA converting part and a predetermined reference level; and
a sub-comparator having an offset less than a quantization unit and being configured to output a binary signal on the basis of a second comparison result between the analog signal output from the DA converting part and the predetermined reference level;
a successive approximation controller configured to input the binary signal on the basis of the first comparison result and output a digital signal on the basis of a conversion result of the DA converting part, the digital signal being formed of the binary signal representing the first comparison result; and
a correction unit configured to correct the digital signal output from the successive approximation controller based on the binary signal representing the second comparison result output from the sub-comparator,
wherein the successive approximation controller inputs into the DA converting part a binary signal differing from the binary signal representing the first comparison result of the main-comparator in a case where the binary signal representing the first comparison result of the main-comparator differs from the binary signal representing the second comparison result of the sub-comparator, and
wherein the correction unit corrects the digital signal utilizing the binary signal representing the first comparison result output from the main-comparator in a case where the successive approximation controller inputs into the DA converting part the binary signal differing from the binary signal representing the first comparison result of the main-comparator.

16. The analog-to-digital converter as claimed in claim 15, wherein the correction unit corrects the digital signal utilizing errors of respective bits derived based on the binary signal representing the first comparison result of the main-comparator, in a case where an absolute value of an error contained in the DA converting part is greater than the offset, and the second comparison value of the sub-comparator is a fixed value.

17. An electronic apparatus comprising:
the analog-to-digital converter as claimed in claim 1; and
a processor configured to process the digital signal digitally converted by the analog-to-digital converter.

* * * * *